(12) United States Patent
Makuta

(10) Patent No.: US 6,896,393 B2
(45) Date of Patent: May 24, 2005

(54) LIGHT EMITTING MODULE

(75) Inventor: Isao Makuta, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 10/422,629

(22) Filed: Apr. 23, 2003

(65) Prior Publication Data

US 2004/0012964 A1 Jan. 22, 2004

(30) Foreign Application Priority Data

Apr. 30, 2002 (JP) ........................................ 2002-128412

(51) Int. Cl.⁷ .......................................... F21V 29/00
(52) U.S. Cl. ...................................... 362/294
(58) Field of Search ........................... 362/294; 257/10, 257/99, 706, 707, 720; 361/702, 704, 707, 709, 717, 719, 386, 388, 389, 391, 400

(56) References Cited

U.S. PATENT DOCUMENTS 5,528,474 A * 6/1996 Roney et al. ............... 362/545
5,731,067 A * 3/1998 Asai et al. .................. 428/210
6,329,605 B1 * 12/2001 Beroz et al. ................ 174/256

\* cited by examiner

*Primary Examiner*—Sandra O'Shea
*Assistant Examiner*—Mark Tsidulko
(74) *Attorney, Agent, or Firm*—Osha Liang LLP

(57) ABSTRACT

By use of a simple structure, also without enlarging thickness and size too much, provided is a light emitting module which can improve heat dissipation of a light emitting component. On a surface of a wiring substrate, a pair of lands face to each other, and two wiring line is connected to the land, respectively. A mounting side outside electrode of a light emitting component is connected to a lead frame to which a light emitting element is die-bonded, and a non-mounting side outside electrode is connected to a lead frame which is connected to the light emitting element through a bonding wire. And, the mounting side outside electrode is bonded to the land by solder, and the non-mounting side outside electrode is bonded to the land by solder and thereby, the light emitting component is mounted on the wiring substrate. A line width of the wiring line at a side to which the mounting side outside electrode of the light emitting component is soldered is made to be larger than a line width of the wiring line at a side to which the non-mounting side outside electrode is soldered.

1 Claim, 22 Drawing Sheets

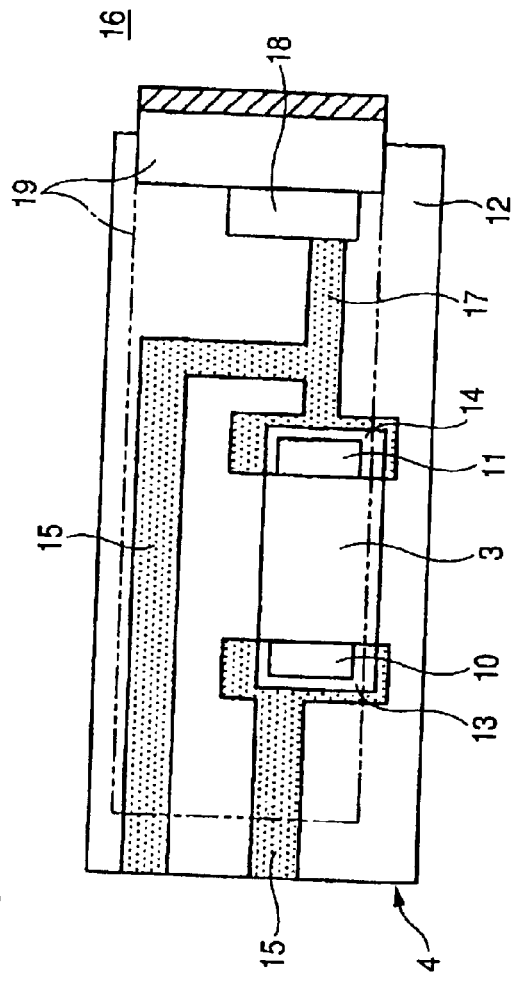
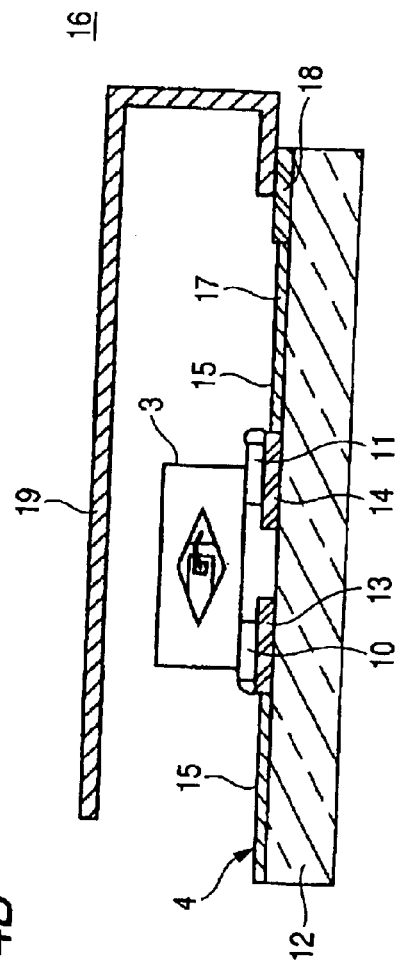
FIG. 4A
FIG. 4B

LIGHT EMITTING MODULE

BACKGROUND OF THE INVENTION

1. Field of the Invention

This invention relates to a light emitting module in which a light emitting element is mounted on a wiring substrate. In particular, it relates to a light emitting module which is used in a flat illuminating device.

2. Description of the Related Art

A liquid crystal display device has a feature that it is thin and light weight, and demand thereof is being heightened in personal computers and so on. Therefore, demand for the liquid crystal display devices has been increasing but, since a liquid crystal display panel itself does not emit light, outside light or a flat illuminating device (auxiliary illumination) becomes necessary in order to recognize a display content thereof visually. Also, in these years, based upon significant increase of the demand in mobile devices such as a portable telephone and PDA (Personal Digital Assistance), space saving due to reducing thickness and space and power saving due to battery operation have become important problems of the liquid crystal display device. On this account, space saving of the liquid crystal display device is realized by reduction of thickness of a lighting device, and power saving is accomplished by adopting a light emitting diode (LED).

Then, in the past, in order to realize the power saving of a flat illuminating device (back light, front light, etc.), the flat illuminating device is configured by combining a light emitting module using LED and a light guiding plate. FIGS. 1A and 1B are a cross sectional view and a plan view showing a conventional light emitting module. A light emitting module 1 is one in which a light emitting component 3 with built-in LED 2 was mounted on a wiring substrate 4.

The light emitting component 3, as shown in FIG. 1A, has two lead frames 5 and 6, and the LED 2 is mounted on a tip part of the one lead frame 5. The other lead frame 6 and the LED 2 are connected by a bonding wire 7. The LED 2 is sealed by a transparent mold resin 8, and except for a portion corresponding to a front surface of the LED 2, an outer surface of the transparent mold resin 8 is covered by opaque (e.g., white colored) mold resin 9. Further, on an under surface of the mold resin 9, disposed are a mounting side outside electrode 10 which is conducted to the lead frame 5 on which the LED 2 is mounted and non-mounting side outside electrode 11 which is conducted to the other lead frame 6.

On the other hand, the wiring substrate 4 is one in which a pair of lands 13 and 14 are made to face to each other on a surface of an insulation substrate 12, and two wiring lines 15 formed on the surface of the insulation substrate 12 are made to be connected to the respective lands 13 and 14. And, by soldering the mounting-side outside electrode 10 and the non-mounting side outside electrode 11 to the lands 13 and 14, respectively, the light emitting component 3 is mounted on the wiring substrate 4.

However, in the suchlike light emitting module 1, there is a problem that light emission luminance of the LED 2 comes down by heat generation (heat loss) from the LED 2. FIG. 2 is a view showing a relation between LED temperature (ambient temperature) and luminance, in a naked situation that the LED 2 is not covered by the mold resins 8 and 9. When the light emitting module 1 is activated, temperature of the LED 2 increases little by little due to heat generation of the LED 2, and as a result, as shown in FIG. 2, light emission luminance of the LED 2 decreases little by little.

Furthermore, when temperature of the light emitting component 3 increases, a transmission factor of the transparent mold resin 8 decreases, and thereby, there is a problem that, a ratio of light emerging from the front surface of the light emitting component 3 out of light emitted by the LED 2 decreases and light utilization ratio decreases. FIG. 3 is a view (a unit of luminance of a vertical axis is made to be the same as that of FIG. 2) showing a relation between LED temperature (ambient temperature) and luminance, in a situation that the LED 2 was covered by the mold resins 8 and 9. Comparing FIGS. 2 and 3, decrease of the luminance is more significant in the case of FIG. 3 where the LED 2 is covered by the resins 8 and 9 but, this is caused by such a matter that, when the transparent mold resin 8 is exposed to high temperature, it is deteriorated little by little (transparency falls down) so that a transmission factor thereof decreases.

On that account, in a conventional light emitting module shown in FIG. 4, by disposing heat dissipation means, temperature increase of the light emitting module is prevented. In this light emitting module 16, as shown in FIGS. 4A and 4B, a dummy wiring 17 is extended from the wiring line 15 of a side which is connected to the land 14, and a heat dissipation plate (heat sink) 19 made by a metal frame is soldered to, or secured by rivets to a land 18 which is disposed at a tip of the dummy wiring 17, and the heat sink 19 is folded toward an upper surface side of the wiring substrate 4 with a space so as not to become an obstacle.

By the suchlike heat dissipation means, heat generated in the light emitting component 3 is dissipated from the heat sink 19 through the dummy wiring 17 and the land 18. However, in the suchlike structure, there is a problem that size or thickness of the light emitting module 16 is enlarged because of the heat sink 19, and a space for disposing the light emitting module 16 is enlarged. Also, in the suchlike light emitting module 16, after the light emitting component 3 was mounted, the heat sink 19 has to be folded, and there is a problem that the number of man-hour for manufacturing the light emitting module 16 increases.

SUMMARY OF THE INVENTION

The invention is made in the light of the above-described problems of the conventional example, and an object thereof is to provide a light emitting module which can improve heat dissipation of a light emitting component by a simple structure of designing a wiring substrate nicely.

Another object of the invention is to provide a light emitting module which can be easily attached without folding a heat sink, and furthermore, realize space saving.

A first light emitting module relating to the invention is characterized by a light emitting module in which a light emitting element is mounted on a wiring substrate, and a heat dissipation function is given to a wiring portion which is formed on the wiring substrate and connected to the light emitting element. Here, the wiring portion is of a wide concept including, but not limited to a wiring line, a land, a via hole, a through hole, wiring inside the wiring substrate and soon. In addition, the first light emitting module corresponds to a first embodiment, a second embodiment, a third embodiment, a fourth embodiment, a fifth embodiment, a seventh embodiment, and a ninth embodiment in embodiments of the invention which will be described later.

As a method for giving the heat dissipation function to the wiring portion, there are a method of widening a width of the wiring portion, a method of widening an area of the wiring portion, a method of enlarging a thickness of the wiring portion, a method of enlarging a volume of the wiring portion, a method of using a material with high heat conductivity for the wiring portion, a method of adding a heat sink to the wiring portion and so on. In particular, in the method of widening the area of the wiring portion, it is desirable that a whole area of the wring portion is made to be 50% or more of the area of the wiring substrate.

In the first light emitting module, since the heat dissipation function is given to the wiring portion which is formed on the wiring substrate, heat generated in the light emitting element is dissipated through the wiring portion of the wiring substrate, and it is possible to suppress temperature increase of the light emitting element. Thus, according to the first light emitting module, it is possible to suppress temperature increase of the light emitting module and prevent luminance of the light emitting module from decreasing.

Also, in the first light emitting module, since the wiring portion may be disposed so as to give the heat dissipation function, on the occasion of manufacturing the wiring substrate, it is possible to easily give the heat dissipation function. Further, since the wiring portion has the heat dissipation function, it is possible to miniaturize the light emitting module having a heat dissipation part.

In an embodiment of the first light emitting module relating to the invention, out of the wiring portions formed on the wiring substrate, heat dissipation of a wiring portion which is connected to the light emitting element through a passage with relatively small thermal resistance is made to be higher than heat dissipation of a wiring portion which is connected to the light emitting element through a passage with relatively large thermal resistance. Here, the wiring portion which is connected to the light emitting element through a passage with relatively small thermal resistance (called as a low thermal resistance side wiring portion) is for example, a wiring portion which is connected to a lead frame side on which the light emitting element is die-bonded. Also, the wiring portion which is connected to the light emitting element through a passage with relatively large thermal resistance (called as a high thermal resistance side wiring portion) is, for example, a wiring portion which is connected to a lead frame side connected to the light emitting element through a bonding wire.

As a method of heighten heat dissipation of the wiring portion which is connected to the light emitting element through a passage with relatively small thermal resistance than the wiring portion which is connected to the light emitting element through a passage with relatively large thermal resistance, there are a method of widening a width of the low thermal resistance side wiring portion than a width of the high thermal resistance side wiring portion, a method of enlarging an area of the low thermal resistance side wiring portion than an area of the high thermal resistance side wiring portion, a method of enlarging a thickness of the low thermal resistance side wiring portion than thickness of the high thermal resistance side wiring portion, a method of enlarging a volume of the low thermal resistance side wiring portion than a volume of the high thermal resistance side wiring portion, a method of using a material with higher heat conductivity than that of the high thermal resistance side wiring portion, a method of adding a heat sink only to the low thermal resistance side wiring portion.

According to the suchlike embodiment, since heat generated in the light emitting element flows more toward the low thermal resistance side wiring portion, by heightening heat dissipation of this low thermal resistance side wiring portion, it is possible to effectively dissipate the heat generated in the light emitting element, and it is possible to heighten more an advantage for preventing temperature increase of the light emitting element. In particular, this embodiment is advantageous to a case in which an area where the low thermal resistance side wiring portion and the high thermal resistance side wiring portion are disposed is restricted, a case in which it is desired to suppress cost of the light emitting module, and so on.

In another embodiment of the first light emitting module relating to the invention, a surface of the wiring substrate is covered by a layer for preventing solder from flowing out, and the wiring portion is exposed to the whole area of an opening formed in the layer for preventing solder from flowing out, and the light emitting element is connected to an exposed surface of the wiring portion exposed from the layer for preventing solder from flowing out.

According to the suchlike embodiment, since it is possible to mount the light emitting element etc. based upon a position of the opening formed in the layer for preventing solder from flowing out (or a wiring portion exposed from the opening), disappears a case that size of the wiring portion itself is subject to constraint by mounting accuracy. Thus, it is possible to enlarge an area of the wiring portion and to heighten heat dissipation of the wiring portion, and it is possible to realize the light emitting module with excellent heat dissipation and mounting.

A second light emitting module relating to the invention is characterized by a light emitting module in which a light emitting element is mounted on a wiring substrate, and a heat dissipation part is disposed inside the wiring substrate. In addition, the second light emitting module corresponds to a seventh embodiment of the embodiments in the invention which will be described later.

In the second light emitting module, since the heat dissipation part with good heat conductivity is disposed inside the wiring substrate, heat generated in the light emitting element is dissipated from the heat dissipation part inside the wiring substrate, and it is possible to suppress temperature increase of the light emitting element. Also, in case that the heat dissipation part is disposed inside the wiring substrate, since it is possible to dispose a plate-shaped heat dissipation part in the form of a plurality of layers, it is also possible to obtain a high heat dissipation effect. Thus, according to the second light emitting module, it is possible to suppress temperature increase of the light emitting module and to prevent decrease of luminance of the light emitting module.

Also, in the second light emitting module, since the heat dissipation part may be simply disposed inside the wiring substrate in a manufacturing process of the wiring substrate, it is possible to easily dispose the heat dissipation part. Furthermore, since the heat dissipation part is disposed inside the wiring substrate, it is possible to miniaturize the light emitting module with the heat dissipation part.

A third light emitting module relating to the invention is characterized by a light emitting module in which a light emitting element is mounted on a wiring substrate, and a heat dissipation part is disposed so as to closely contact a back surface of the wiring substrate. In addition, the third light emitting module corresponds to a sixth embodiment in the embodiments of the invention which will be described later.

In the third light emitting module, since the heat dissipation part with good heat conductivity is disposed on the back surface of the wiring substrate, heat generated in the light emitting element is dissipated from the heat dissipation part on the back surface of the wiring substrate, and it is possible to suppress temperature increase of the light emitting element. Also, except for a double-sided wiring substrate and so on, since it is possible to dispose the beat dissipation part on almost the entire back surface of the wiring substrate, it is also possible to obtain a high heat dissipation effect. Thus, according to the third light emitting module, it is possible to suppress temperature increase of the light emitting module and to prevent decrease of luminance of the light emitting module.

Also, in the third light emitting module, since the heat dissipation part may be simply attached to the back surface of the wiring substrate, it is possible to easily dispose the heat dissipation part. Furthermore, since the heat dissipation part (e.g., heat dissipation part of plate shape) is disposed so as to closely contact the back surface of the wiring substrate, it is possible to miniaturize the light emitting module with the heat dissipation part.

A fourth light emitting module relating to the invention is characterized by a light emitting module in which a light emitting element sealed in a package is mounted on a wiring substrate, and a heat dissipation part is attached to a surface of the package. In addition, the fourth light emitting module corresponds to an eighth embodiment in the embodiments of the invention which will be described later.

In the fourth light emitting module, since the heat dissipation part with good heat conductivity is attached to the package in which the light emitting element is sealed, heat generated in the light emitting element is dissipated from the heat dissipation part through the package, it is possible to suppress temperature increase of the light emitting element, thereby preventing decrease of luminance of the light emitting module. Also, since the heat dissipation part can be easily attached to the package by use of adhesive etc., attachment of the heat dissipation part is readily carried out. Furthermore, since there occurs no space between the package and the heat dissipation part as in the conventional example, it is possible to miniaturize the light emitting module with the heat dissipation part.

In addition, the structural components of this invention described above can be combined wherever possible.

BRIEF DESCRIPTION OF THE DRAWINGS

The invention, together with further advantages thereof, may best be understood by reference to the following description taken in conjunction with the accompanying drawings in which:

FIGS. 4A and 4B are a plan view and a cross sectional view showing the other conventional light emitting module having heat dissipation means, with partial omission;

DETAILED DESCRIPTION OF THE PREFERRED EMBODIMENTS (First Embodiment)

Figure 5:
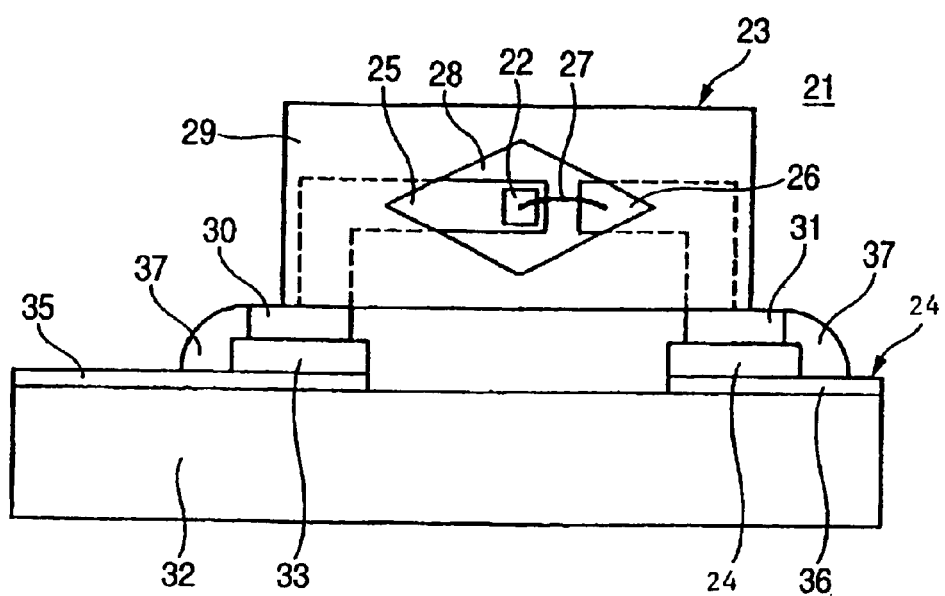
FIG. 5 is a front view showing a structure of a light emitting module according to one embodiment of the invention.
Figure 6:
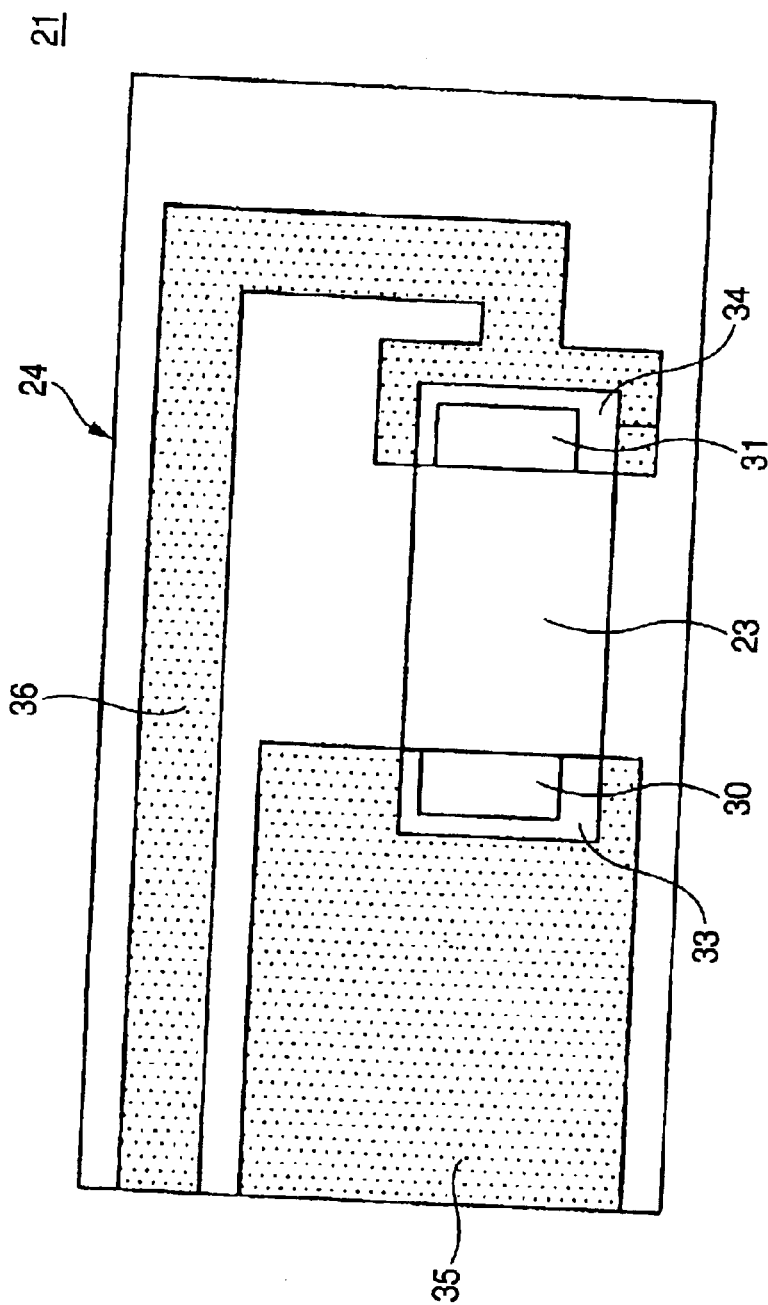
FIG. 6 is a plan view of the same light emitting module as above.

FIG. 5 is a front view showing a structure of a light emitting module according one embodiment of the invention, and FIG. 6 is a plan view thereof. This light emitting module 21 is one which is used as a light source of a flat illuminating device that is used, for example, as a back light of a liquid crystal display device, a front light of a reflection type liquid crystal display device and so on.

The light emitting module 21 is one in which a light emitting component 23 is mounted on a wiring substrate 24 such as a printed wiring board, a flexible substrate and so on. The light emitting component 23 is one in which a light emitting element 22 such as LED and so on is built in a package, and as indicated in FIG. 5, has two lead frames 25 and 26, and the light emitting element 22 is mounted on a tip part of the mounting side lead frame 25, and the non-mounting side lead frame 26 and the light emitting element 22 are electrically connected by a bonding wire 27. At least a portion of the light emitting element 22 is sealed by transparent mold resin 28, and except for a portion corresponding to a front surface of the light emitting element 22, an outer surface of the transparent mold resin 28 is covered by opaque (e.g., white colored) mold resin 29. Furthermore, on an under surface of the mold resin 29, a mounting side outside electrode 30 which is conducted to the mounting side lead frame 25 on which the light emitting element 22 is mounted and a non-mounting side outside electrode 31 which is conducted to the non-mounting side lead frame 26 are disposed.

On the other hand, the wiring substrate 24 is one in which, on a surface of an insulation substrate 32 such as a flexible substrate, a glass epoxy resin substrate and so on, a pair of the lands 33 and 34 are made to face to each other, and the two wiring lines 35 and 36 formed by Cu etc. on the surface of the insulation substrate 32 are connected to the lands 33 and 34, respectively. And, the mounting side outside electrode 30 is bonded to the land 33 by solder 37, and the non-mounting side outside electrode 31 is bonded to the land 34 by solder 37 and thereby, the light emitting component 23 is mounted on the wiring substrate 24. Here, a line width of the wiring line 35 at a side to which the mounting side outside electrode 30 of the light emitting component 23 is soldered is made to be larger than a line width of the wiring line 36 at a side to which the non-mounting side outside electrode 31 is soldered. In particular, it is desirable to make the line width of the wiring line 35 wider as many as possible, within the scope of the width of the wiring substrate 24.

In this light emitting module 21, since the width of the wiring line 35 is made to be wider, it is possible to give a function of a heat sink to the wiring line 35 and heat generated in the light emitting component 23 is conducted to the wiring line 35, and dissipated from the wiring line 35 to air. Thus, according to the suchlike heat dissipation method, an extra component for dissipating heat is not necessary, and in addition, there occurs no case that size of the light emitting module 21 is enlarged by the component for heat dissipation, and it is possible to improve heat dissipation of the light emitting module 21 over maintaining space saving in a limited space.

Also, out of the outside electrodes of the light emitting component 23, the mounting side outside electrode 30 is connected directly to the mounting side lead frame 25 on which the light emitting element 22 is mounted but, the non-mounting side outside electrode 31 is connected to the light emitting element 22 through the bonding wire 27 and the non-mounting side lead frame 26 so that heat of the light emitting element 22 is conducted to the mounting side outside electrode 30 and it may be easy for temperature to increase but, it is difficult for the heat of the light emitting element 22 to conduct to the non-mounting side outside electrode 31. In the light emitting module 21 of this embodiment, since widened is the width of the wiring line 35 at the side to which the mounting side outside electrode 30 is soldered, it is possible to effectively dissipate heat generated in the light emitting element 22, and it is possible to effectively suppress temperature increase of the light emitting element 22 or the light emitting component 23. Thus, according to the light emitting module 21 of the invention, it is possible to prevent decrease of luminance of the light emitting element 22 due to temperature increase and decrease of a transmission factor of the mold resin 28, and it is possible to obtain the light emitting module 21 with small size and high performance.

Figure 1A:
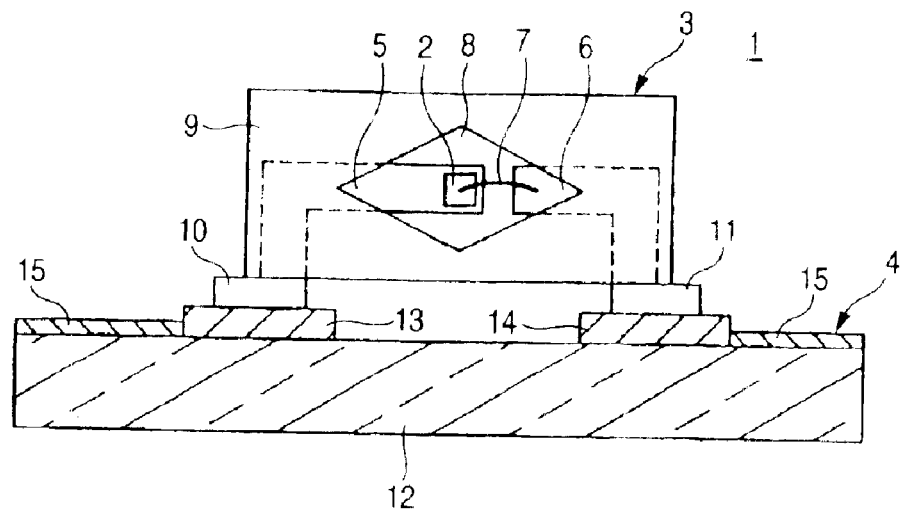
FIGS. 1A and 1B are a cross sectional view and a plan view showing a conventional light emitting module.
Figure 1B:
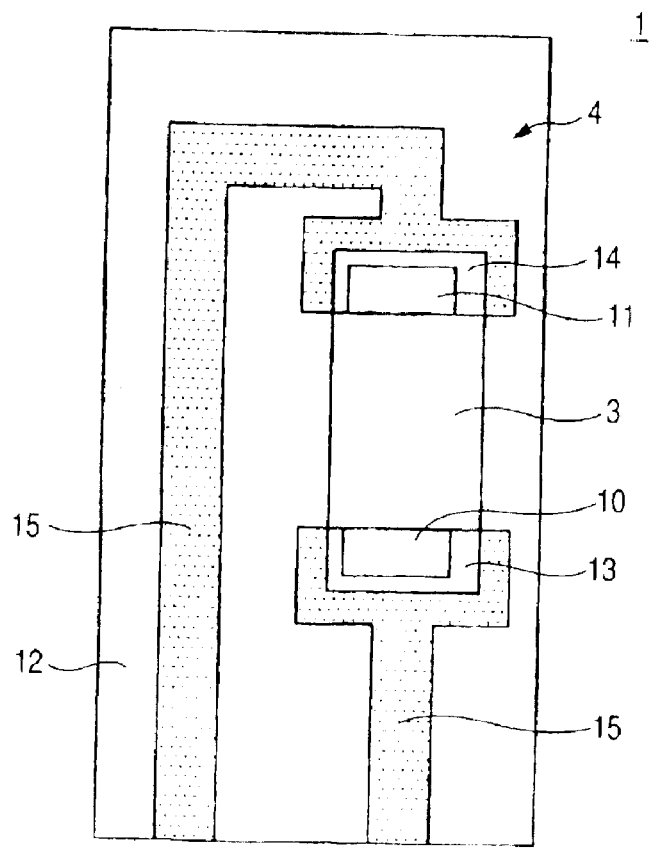
Figure 2:
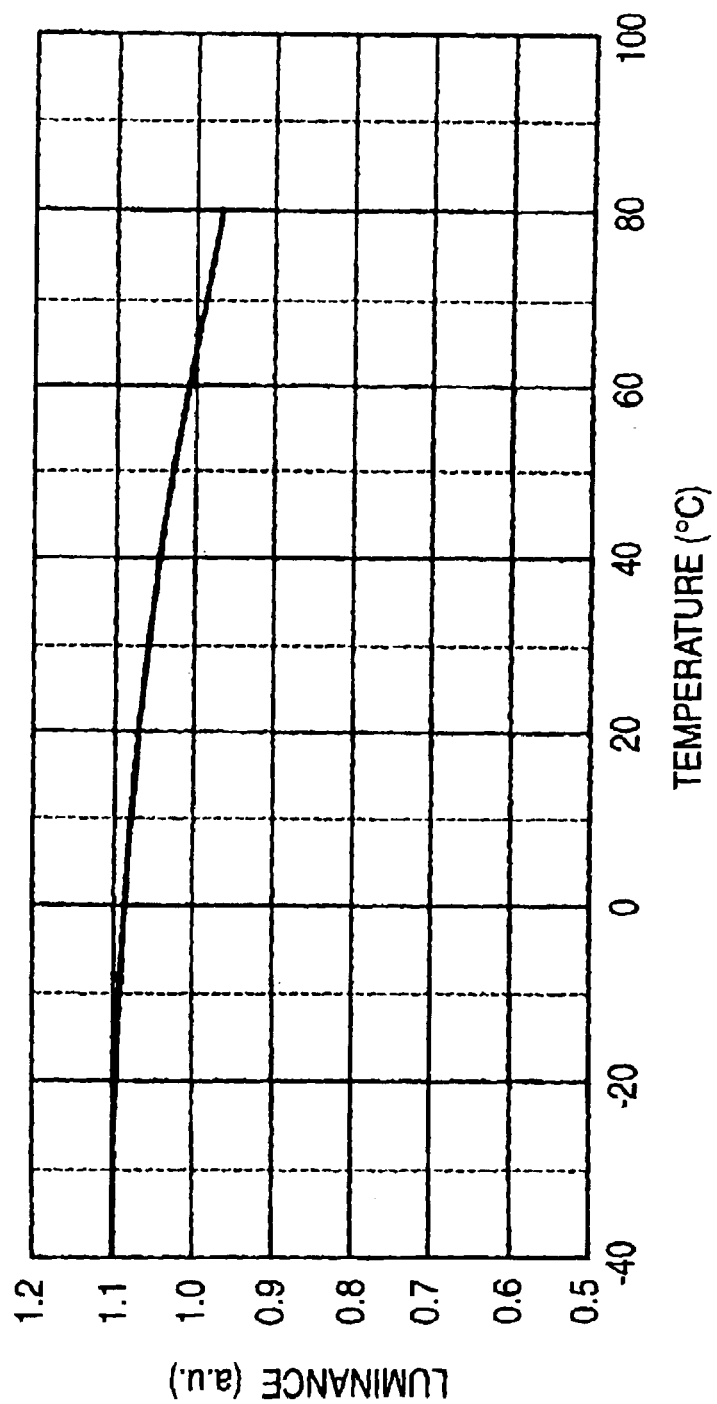
FIG. 2 is a view showing a relation between temperature (ambient temperature) and luminance of LED which is not covered by mold resin.
Figure 3:
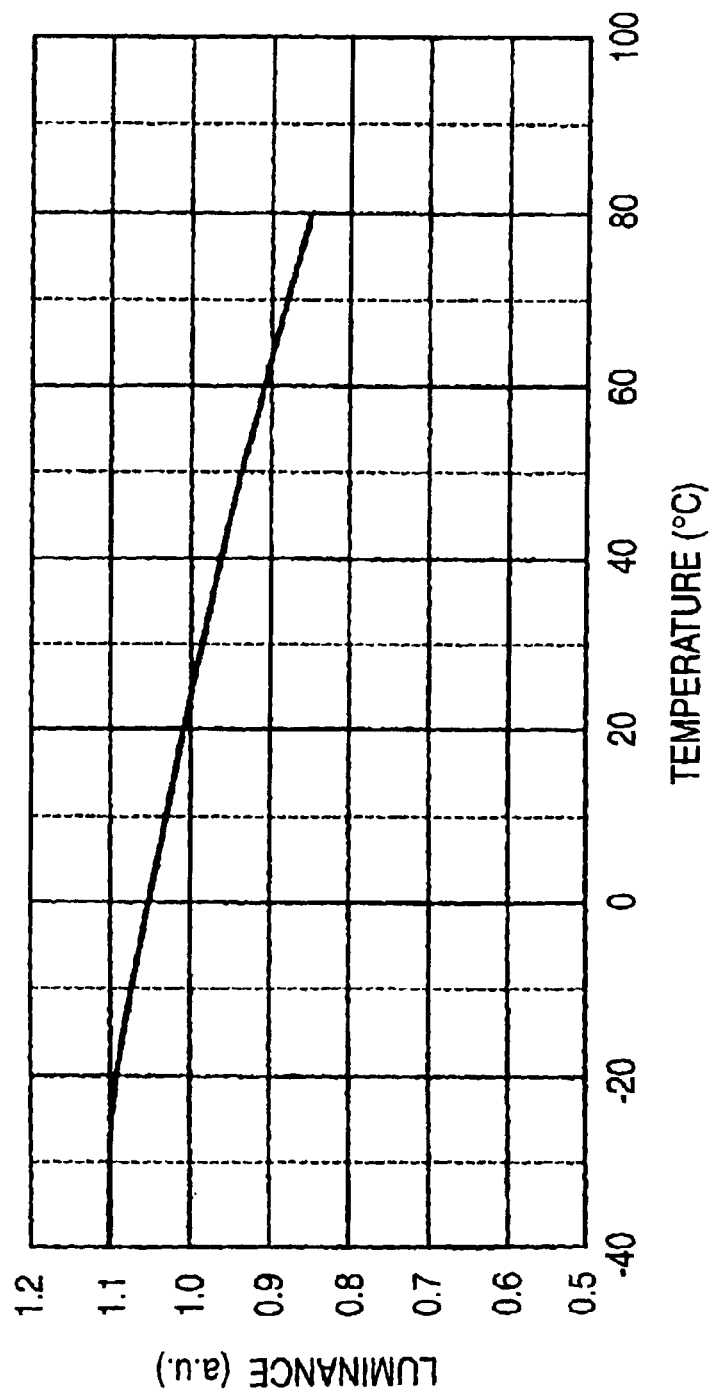
FIG. 3 is a view showing a relation between temperature (ambient temperature) and luminance of LED which is covered by mold resin.
Figure 7:
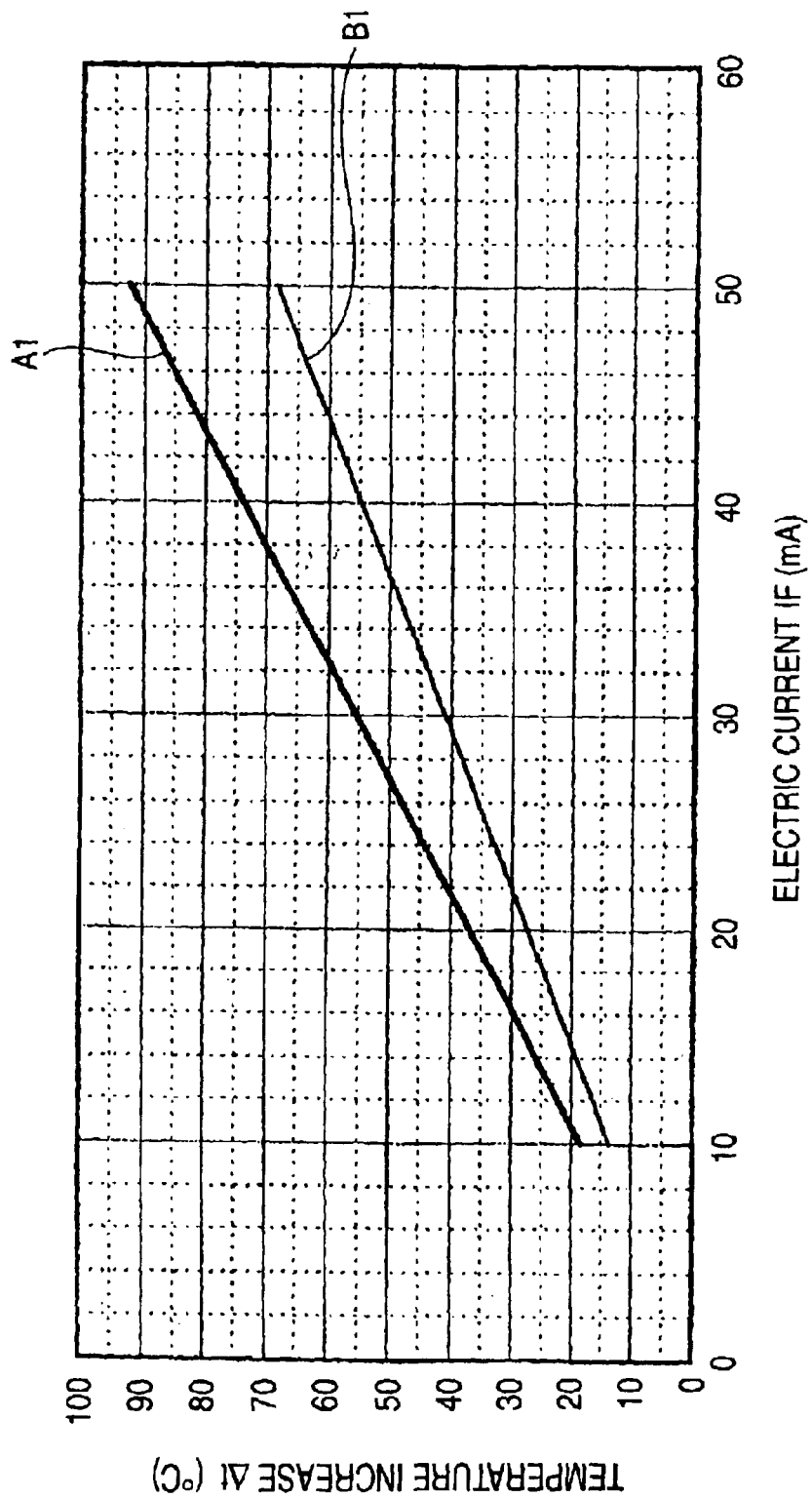
FIG. 7 is a view comparing heat dissipation of the light emitting module in the conventional example and that of the light emitting module shown in FIGS. 5 and 6.

FIG. 7 is a view comparing heat dissipation of the conventional light emitting module of a structure as shown in FIG. 1 and that of the light emitting module 21 according to this embodiment as shown in FIGS. 5 and 6. A line A1 of FIG. 7 shows temperature increase of the conventional example, and a line B1 shows temperature increase of the light emitting module 21 according to this embodiment, and a horizontal axis of FIG. 7 indicates an electric current IF which flows through the light emitting element 22, and a vertical axis indicates temperature increase $\Delta t$ (temperature difference with room temperature). Here, a sample of the conventional example which was used for a test was one in which the width of the wiring substrate is 3 mm, and the line width of the both wiring lines 15 is 0.2 mm. Also, a sample of the embodiment of this invention which was used for the test was one in which the width of the wiring substrate 24 is 3 mm, and the width of the wiring line 35 at mounting side is 2 mm, and the width of the wiring line 36 at non-mounting side is 0.2 mm. As known from FIG. 7, if the same flowing electric current is used, in the light emitting module 21 of the invention, temperature increase can be suppressed as compared to the light emitting module 1 of the conventional example, and a difference of the temperature increase has become marked as the flowing electric current value IF increases.

Figure 8:
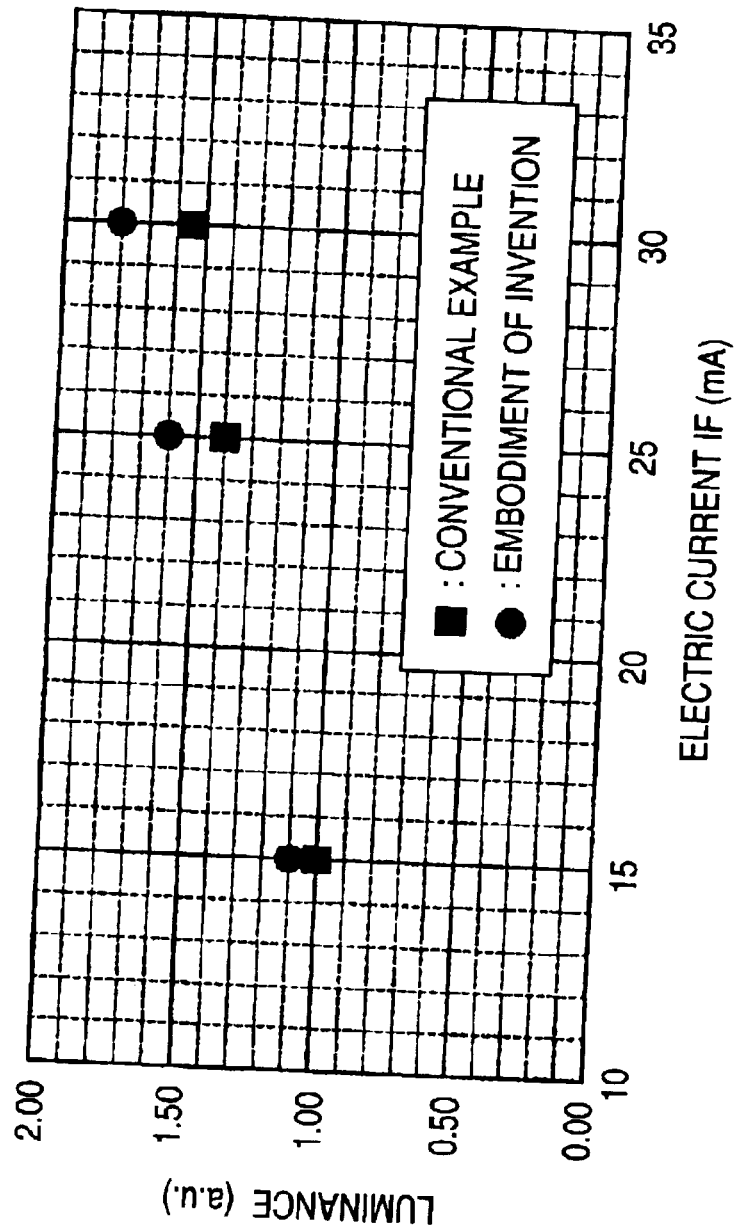
FIG. 8 is a view comparing and showing a current characteristic of luminance of the light emitting module in the conventional example and that of the light emitting module shown in FIGS. 5 and 6.

FIG. 8 is also a view showing a current characteristic of luminance of the light emitting module of the conventional example (FIG. 1) and that of the light emitting module of the embodiment (FIGS. 5 and 6). A horizontal axis of FIG. 8 shows the electric current IF which flows through the light emitting element, and a vertical axis indicates luminance of each light emitting module. Here, a black circle mark (●) indicates the luminance of the light emitting module 21 of the embodiment, and a black square mark (■) indicates the luminance of the light emitting module 1 of the conventional example. Since the light emitting module 21 of the invention can suppress temperature increase as compared to the conventional example as shown in FIG. 7, if the same flowing electric current value is used, the luminance has become large by that.

Figure 9:
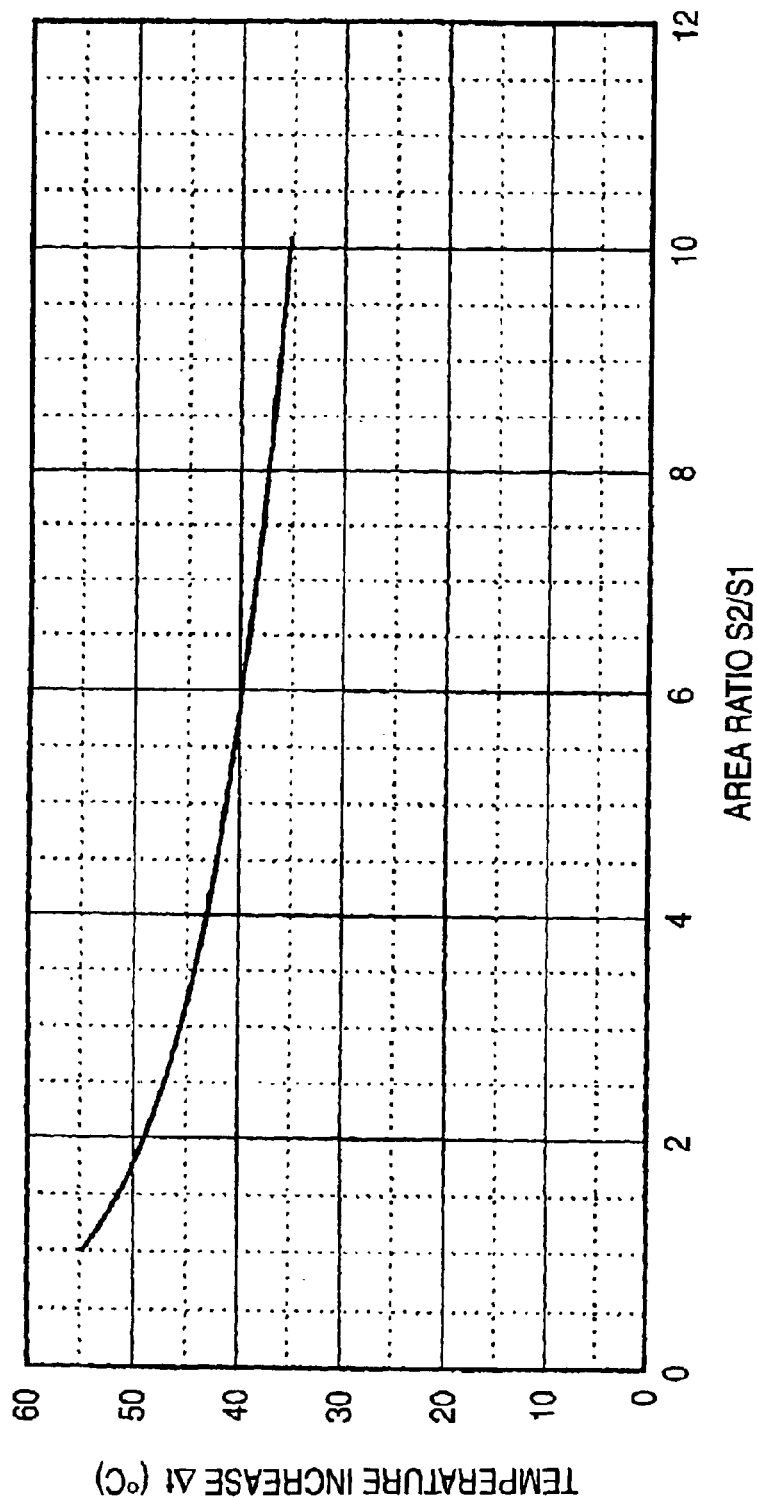
FIG. 9 is a view showing a change of temperature increase Δt of a light emitting component to a ratio S2/S1 of a wiring area S2 of a wring line at a mounting side and a wiring area S1 at a non-mounting side, in the light emitting module shown in FIGS. 5 and 6.

FIG. 9 indicates a relation between a ratio S2/S1 of a wiring area S2 of the wring line 35 at the mounting side and a wiring area S1 at the non-mounting side and temperature increase $\Delta t$ of the light emitting component 23 (in case that an electric current of 30 mA is made to flow through the light emitting element 22). According to FIG. 9, it is known that, as the area of the wiring line 35 at the mounting side is enlarged and the area ratio S2/S1 is enlarged, the temperature increase Δt decreases.

Figure 10:
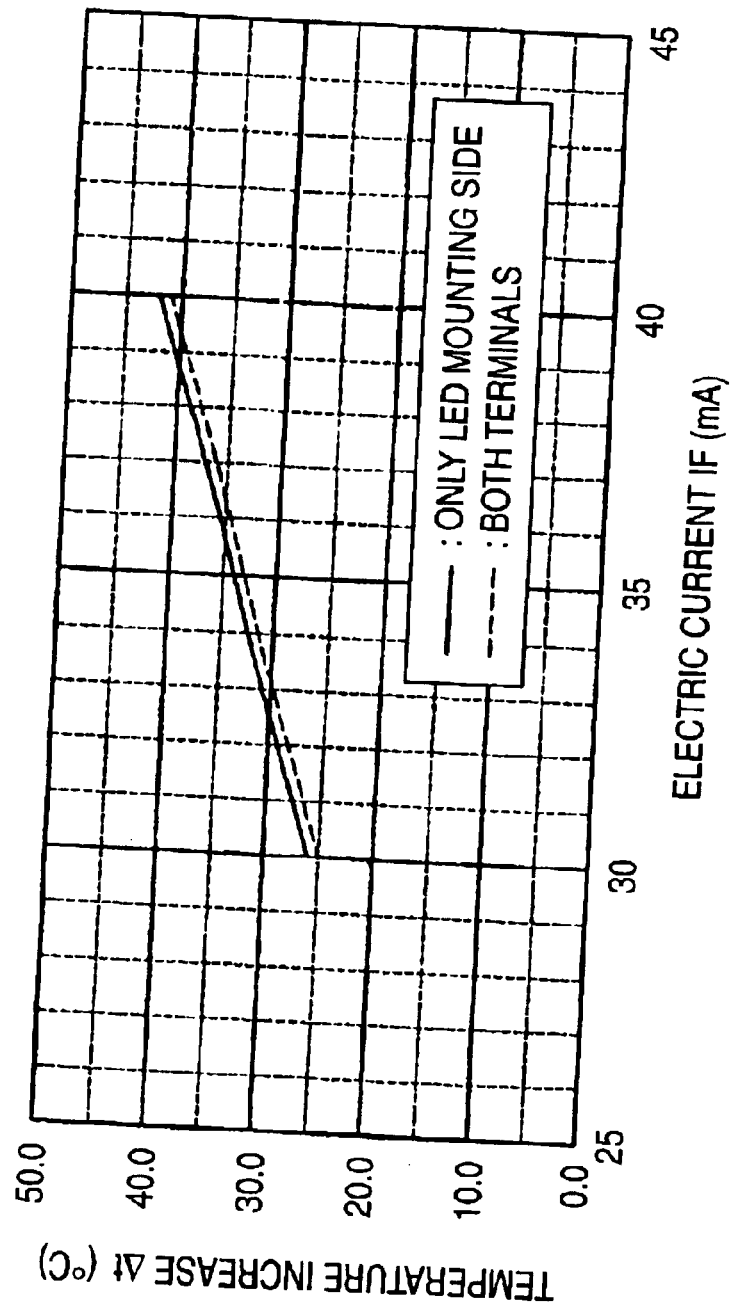
FIG. 10 is a view comparing and showing a heat dissipation characteristic of a case that widened is only a width of a wiring line at a side to which a mounting side outside electrode is connected and that of a case that both wiring lines are widened.

Also, FIG. 10 is a view comparing and showing a heat dissipation characteristic of a case that widened was only the width of the wiring line 35 at the side to which the mounting side outside electrode 30 is connected and that of a case that both wiring lines 35 and 36 were widened. A horizontal axis of FIG. 10 shows the electric current IF which flows through the light emitting element, and a vertical axis indicates the temperature increase (temperature difference with room temperature) Δt. A line of a thick sold line in FIG. 10 indicates temperature increase in case that widened was only the width of the wiring line 35 at the side to which the mounting side outside electrode 30 is connected (the width of the wiring line 35 is 3 mm, and the width of the wiring line 36 is 0.2 mm), and a line of a fine broken line in FIG. 10 indicates temperature increase in case that the both wiring lines 35 and 36 were widened (the width of the wiring line 35 is 3 mm, and the width of the wiring line 36 is 3 mm). As apparent from FIG. 10, even if widened is only the width of the wiring line 35 at the side to which the mounting side outside electrode 30 is connected, even if the both wiring lines 35 and 36 are widened, there is almost no difference in increased temperature of the light emitting module. Accordingly, taking a mounting space, cost and so on into consideration, desirable is a case that widened is only the width of the wiring line 35 at the side to which the mounting side outside electrode 30 is connected.

Also, in the light emitting module 21 of the invention, the heat sink as in the conventional example is not necessary, and it is possible to realize space saving of the light emitting module 21. Also, in the light emitting module 16 of the conventional example, since attention is not focused on a difference in heat release value of the mounting side outside electrode 10 at the side on which the light emitting element (LED) is mounted and that of the non-mounting side outside electrode 11 which is connected to the light emitting element through the bonding wire, the non-mounting side outside electrode 11 is connected to the land 14 at the side where extended is the dummy wiring 17 connected to the heat sink 19. As a result, heat dissipation is carried out at the side with smaller heat release value. In contrast to this, in the light emitting module 21 of the invention, since the mounting side outside electrode 30 at the side on which the light emitting element 22 is mounted is connected to the wiring line 35 with wider width, it is possible to effectively carry out heat dissipation by disposing heat dissipation means at the side with larger heat release value.

(Second Embodiment)

Figure 11A:
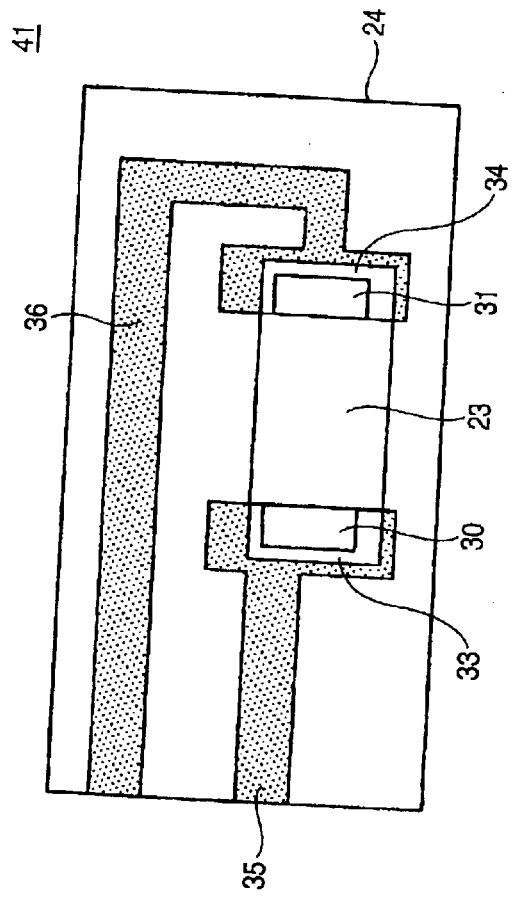
FIGS. 11A and 11B are a plan view and a cross sectional view showing a structure of a light emitting module according to another embodiment of the invention.
Figure 11B:
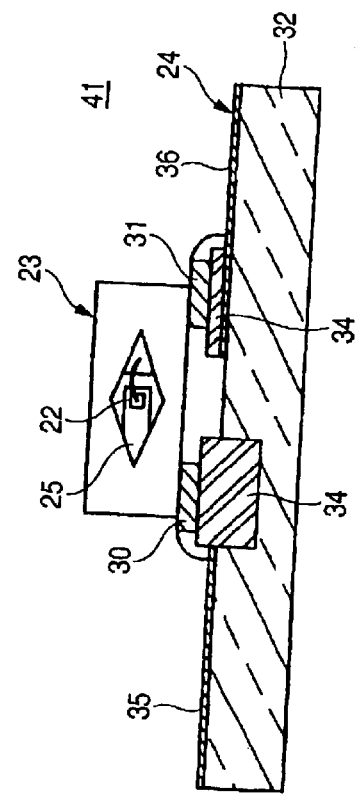

FIGS. 11A and 11B are a plan view and a cross sectional view showing a structure of a light emitting module 41 according to another embodiment of the invention. In this embodiment, a volume of a wiring portion at a side on which a light emitting element 22 is mounted and a volume of a wiring portion at a non-mounting side are made to be different from each other, and the volume of the wiring portion at the mounting side is enlarged than that of the wiring portion at the non-mounting side so that heat dissipation of the light emitting module 41 is improved. In the light emitting module 41 shown in FIG. 11, a thickness of the land 33 made by Cu at the side to which the mounting side outside electrode 30 is connected is enlarged than a thickness of the land 34 made by Cu at the side to which the non-mounting side outside electrode 31 is connected. But, taking the occasion of mounting the light emitting component 23 into consideration, the upper surface of the land 33 is made to be of the same height as the upper surface of the land 34.

According to the suchlike embodiment, the land with larger thickness plays a role of the heat sink, and the mounting side outside electrode 30 connected to the mounting side lead frame 25 on which the light emitting element is mounted is connected to the land 33 with a larger volume so that heat generated by the light emitting element 22 is effectively dissipated, and it is possible to suppress temperature increase of the light emitting component 23. Also, there occurs no case that the light emitting module 41 becomes large by improving the heat dissipation.

Figure 12:
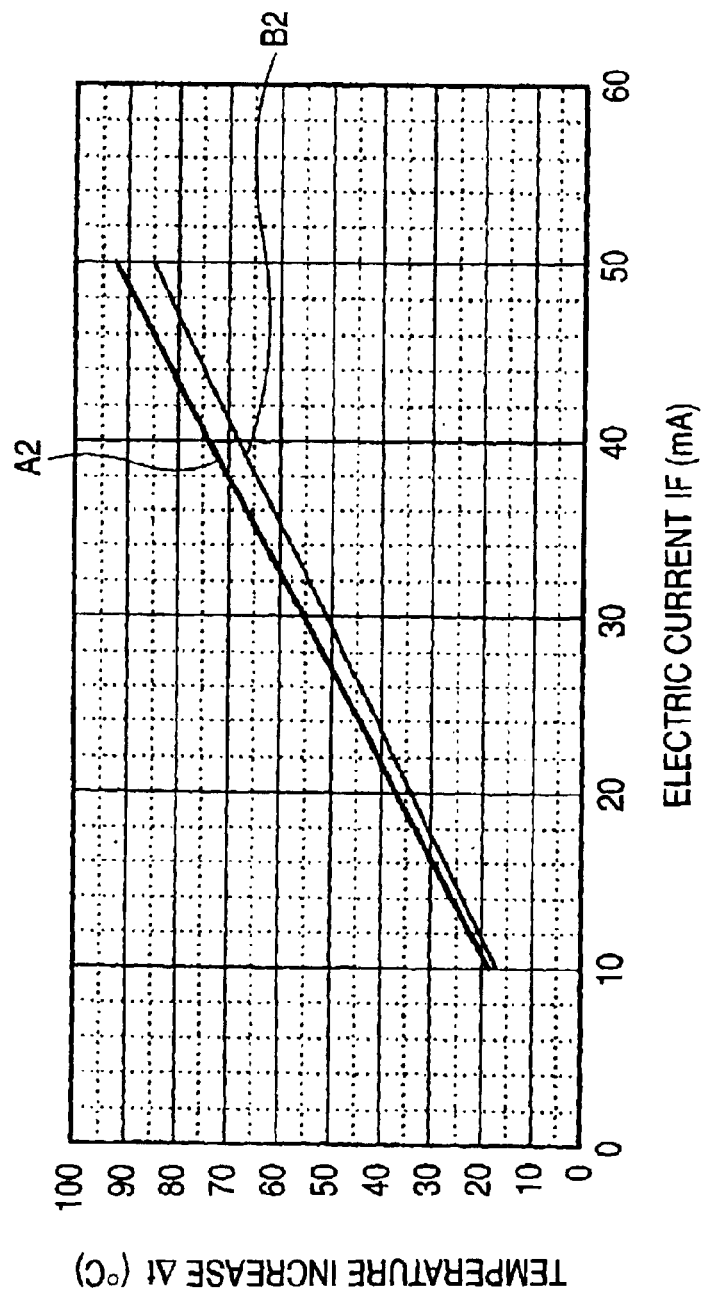
FIG. 12 is a view comparing and showing heat dissipation of the light emitting module in the conventional example and that of the light emitting module of FIG. 11.

FIG. 12 is a view comparing heat dissipation of the conventional light emitting module 1 (FIG. 1) and that of the light emitting module 41 according to the embodiment (FIG. 11). A line A2 of FIG. 12 shows temperature increase of the conventional example, and a line B2 shows temperature increase of the light emitting module 41 according to the embodiment, and a horizontal axis of FIG. 12 indicates the electric current IF which flows through the light emitting element 22, and a vertical axis indicates the temperature increase (temperature difference with room temperature) Δt. As known from FIG. 12, in the light emitting module 41 of the invention, it is possible to suppress the temperature increase as compared to the light emitting module 1 of the conventional example, and a difference in the temperature increase becomes marked as the flowing electric current value If becomes larger.

In addition, here, although a thickness of the land at the mounting side and that of the land at the non-mounting side are made to be different from each other but, a thickness of the wiring line at the mounting side may be enlarged than that of the wiring at the non-mounting side.

(Third Embodiment)

Figure 13:
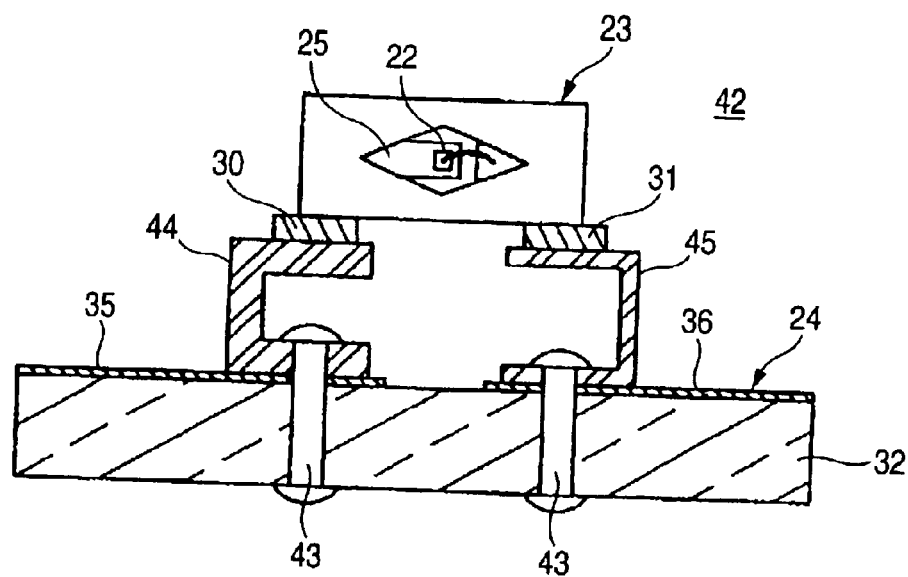
FIG. 13 is a cross sectional view showing a structure of a light emitting module of still another embodiment of the invention.

Also, FIG. 13 is a cross sectional view showing a structure of a light emitting module 42 of still another embodiment in which a volume of the land at the mounting side and that of the land at the non-mounting side are made to be different from each other. In this light emitting module 42, on an upper surface of an end part of the wiring line 35 and on an upper surface of an end part of the wiring part 36, metal members are attached by rivets 43 etc., respectively so that lands 44 and 45 are formed, respectively. Here, the lands 44 and 45 are formed by U-shaped metal members, and the land 44 at the side to which the mounting side outside electrode 30 is soldered is formed by a metal member with a relatively large thickness, and the land 45 at the side to which the non-mounting side outside electrode 31 is soldered is formed by a metal member with a relatively thin thickness so that volumes of the lands 44 and 45 are made to be different from each other and it is designed that dissipation is improved on the land 44 at the mounting side.

Accordingly, also in this embodiment, heat generated in the light emitting element 22 is conducted from the mounting side outside electrode 30 to the land 44, and it is possible to effectively dissipate the heat on the land 44, and it is possible to effectively suppress the temperature increase of the light emitting element 22. Also, according to this embodiment, although a mounting space of the light emitting module 42 may be enlarged in some degree, as compared to the embodiment of FIG. 11, it is possible to miniaturize the light emitting module 42 and realize space saving, as compared to the conventional example shown in FIG. 4.

(Fourth Embodiment)

Figure 14:
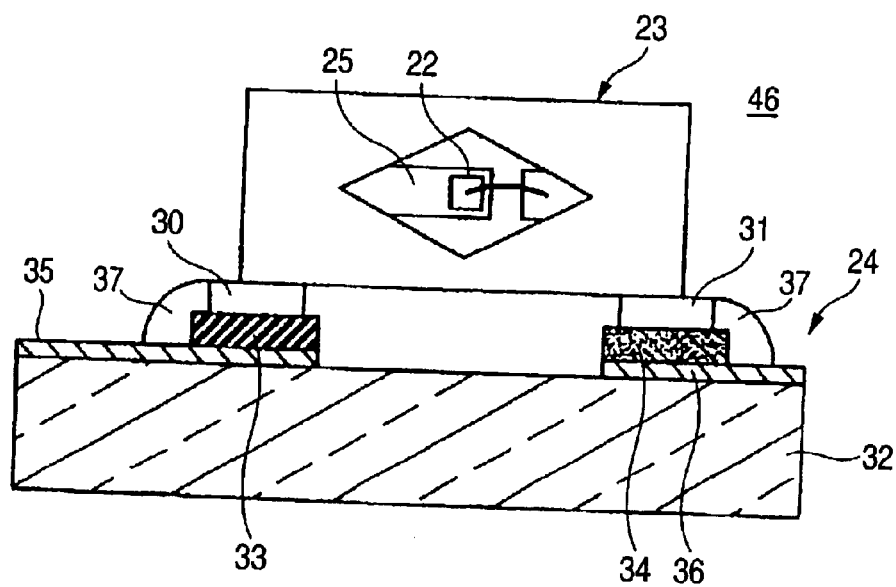
FIG. 14 is a cross sectional view showing a structure of a light emitting module of still another embodiment of the invention.

FIG. 14 is a cross sectional view showing a structure of a light emitting module 46 according to still another embodiment of the invention. In this light emitting module 46, heat conductivity of a material which is used for the wiring portion at the side on which the light emitting element 22 is mounted is different from that of a material which is used for the wiring portion at the non-mounting side. In the light emitting module 46 shown in FIG. 14, the land 33 of the side to which the mounting side outside electrode 30 is connected is formed by Au, and the land 34 of the side to which the non-mounting side outside electrode 31 is connected is formed by Cu.

According to the suchlike embodiment, since the mounting side outside electrode 30 with large heat release value is connected to the land 33 formed by Au with good heat conductivity, heat generated in the light emitting element 22 is effectively dissipated from the land 33, and it is possible to suppress the temperature increase of the light emitting component 23. Furthermore, since the non-mounting side outside electrode 31 is formed by inexpensive metal like Cu, it is possible to suppress increase of cost of the light emitting module 46.

(Fifth Embodiment)

Figure 15:
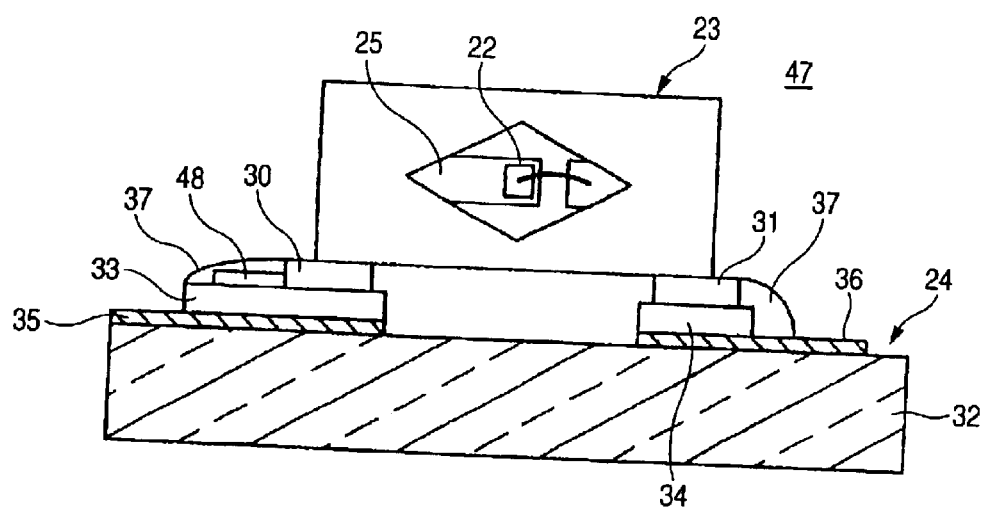
FIG. 15 is a cross sectional view showing a structure of a light emitting module of still another embodiment of the invention.

FIG. 15 is a cross sectional view showing a structure of a light emitting module 47 according to still another embodiment of the invention. In this light emitting module 47, a heat sink 48 is attached in advance to only the land 33 at the side to which the mounting side outside electrode 30 is connected. The heat sink 48 is formed by a material with good heat conductivity such as a copper plate, a graphite sheet, a silicon sheet with high heat conductivity and so on.

According to the suchlike embodiment, since the mounting side outside electrode 30 with large heat release value is connected to the land 33 having the heat sink 48, heat generated in the light emitting element 22 is effectively dissipated from the land 33, and it is possible to suppress the temperature increase of the light emitting component 23. Furthermore, since the heat sink 48 is disposed on only the one land 33, as compared to a case that the heat sinks are disposed on the both lands 33 and 34, assembling processes can be reduced, and component cost can be saved, and also, it is possible to realize space saving of the light emitting module 47.

(Sixth Embodiment)

Figure 16:
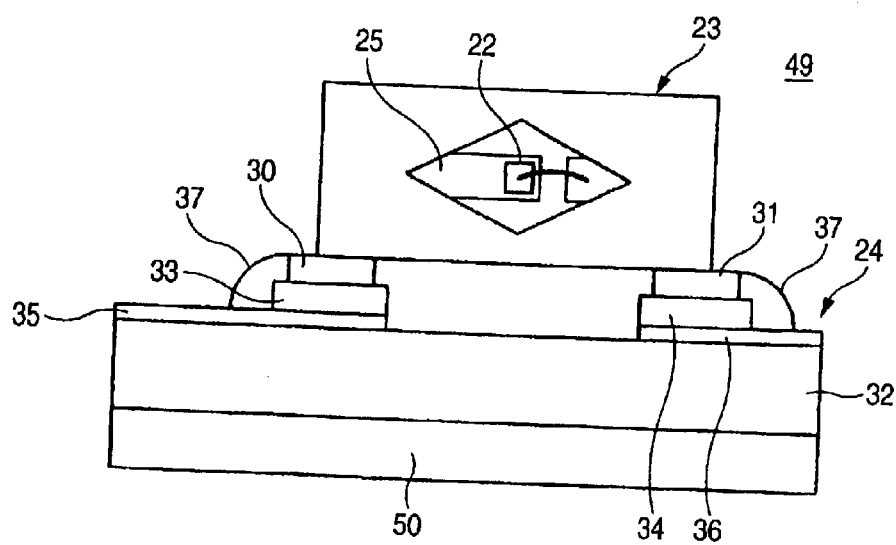
FIG. 16 is a front view showing a structure of a light emitting module of still another embodiment of the invention.

FIG. 16 is a front view showing a structure of a light emitting module 49 according to still another embodiment of the invention. In the light emitting module 49 according to this embodiment, a heat sink 50 is bonded so as to closely contact the whole back surface of an insulation substrate 32 which configures the wiring substrate 24. The heat sink 50 is formed by a material with good heat conductivity such as a copper plate, a graphite sheet, a silicon sheet of high heat conductivity and so on.

According to this embodiment, heat generated in the light emitting component 23 passes through the insulation substrate 32 and reaches the heat sink 50 at a back surface thereof, and dissipated from the whole surface of the heat sink 50 to air. Accordingly, the insulation substrate 32 as thinner as possible is desirable, with such limit that electrical insulation of a front surface side of the insulation substrate 32 and a back surface side thereof is assured.

According to this embodiment, since the heat sink 50 is bonded to the back surface of the wiring substrate 24, there occurs almost no case that size of the light emitting module 49 is enlarged. Also, since the heat sink 50 can be disposed on the whole back surface of the wiring substrate 24, it is possible to obtain a large heat dissipation area. Thus, over maintaining space saving of the light emitting module 49, it is possible to effectively suppress the temperature increase of the light emitting component 23.

Figure 17:
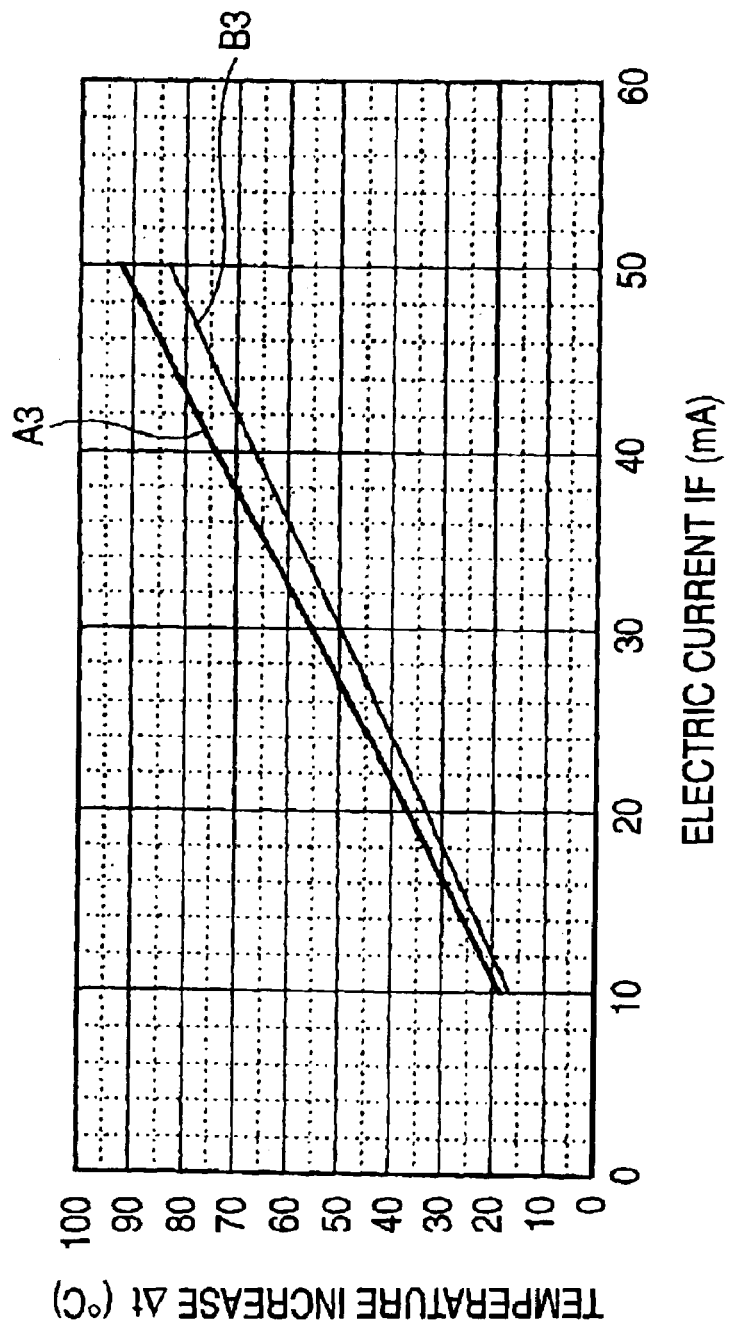
FIG. 17 is a view comparing heat dissipation of the light emitting module in the conventional example and that of the light emitting module of FIG. 16.

FIG. 17 is a view comparing heat dissipation of the conventional light emitting module 1 (FIG. 1) and that of the light emitting module 49 according to this embodiment (FIG. 16). A line A3 of FIG. 17 shows temperature increase of the conventional example, and a line B3 shows temperature increase of the light emitting module 49 according to this embodiment, and a horizontal axis of FIG. 17 indicates the electric current IF which flows through the light emitting element 22, and a vertical axis indicates temperature increase (temperature difference with room temperature) Δt. As known from FIG. 17, in the light emitting module 49 of the invention, it is possible to suppress the temperature increase as compared to the light emitting module 1 of the conventional example, and a difference in the temperature increase becomes marked as the flowing electric current IF becomes larger.

(Seventh Embodiment)

Figure 18:
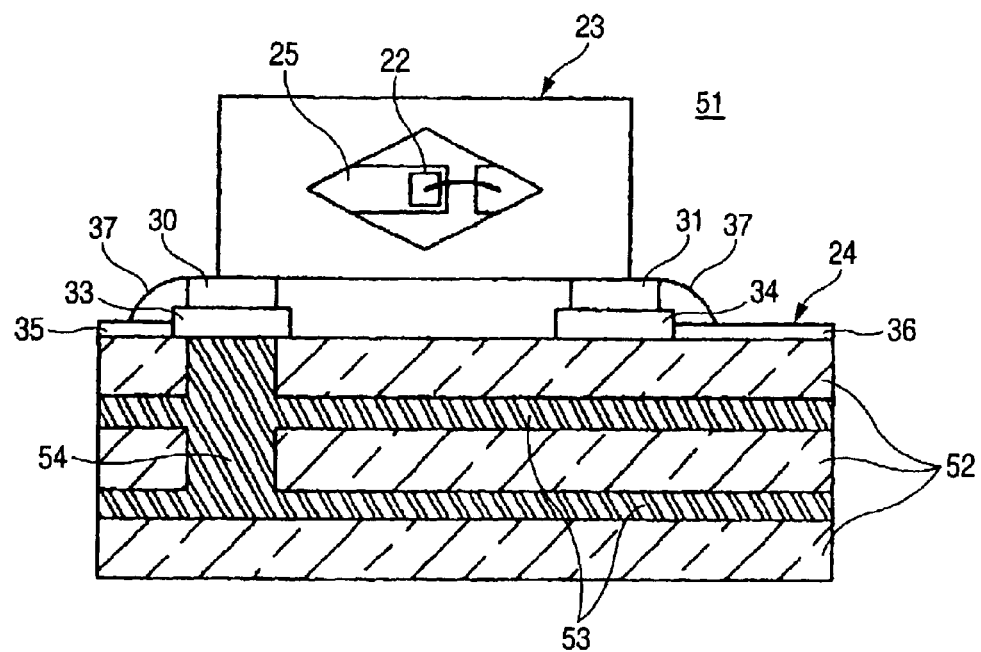
FIG. 18 is a cross sectional view showing a structure of a light emitting module of still another embodiment of the invention.

FIG. 18 is a cross sectional view showing a structure of a light emitting module 51 according to still another embodiment of the invention. In the light emitting module 51 according to this embodiment, the wiring substrate 24 are made as a multiple layer structure of insulation substrates 52 and heat conduction layers 53, and the land 33 to which the mounting side outside electrode 30 is connected is made to be thermally conducted to each heat conduction layer 53 through a via hole (or, a through hole) 54 which is disposed in the wiring substrate 24. In addition, the heat conduction layer 53 is formed by a material with good heat conductivity such as a copper plate, a graphite sheet, a silicon sheet with high heat conductivity, and so on. According to this embodiment, heat generated in the light emitting component 23 is conducted to each heat conduction layer 53 from the land 33 through the via hole 54, and dissipated from the entire wiring substrate 24 to air.

According to this embodiment, since the heat conduction layer 53 is formed by making the wiring substrate with multiple layers, there occurs almost no case that size of the light emitting module 49 is enlarged. Also, since the heat sink 50 can be disposed on the entire wiring substrate 24, it is possible to obtain a larger heat dissipation area. Thus, over maintaining space saving of the light emitting module 51, it is possible to effectively suppress the temperature increase of the light emitting component 23.

(Eighth Embodiment)

Figure 19A:
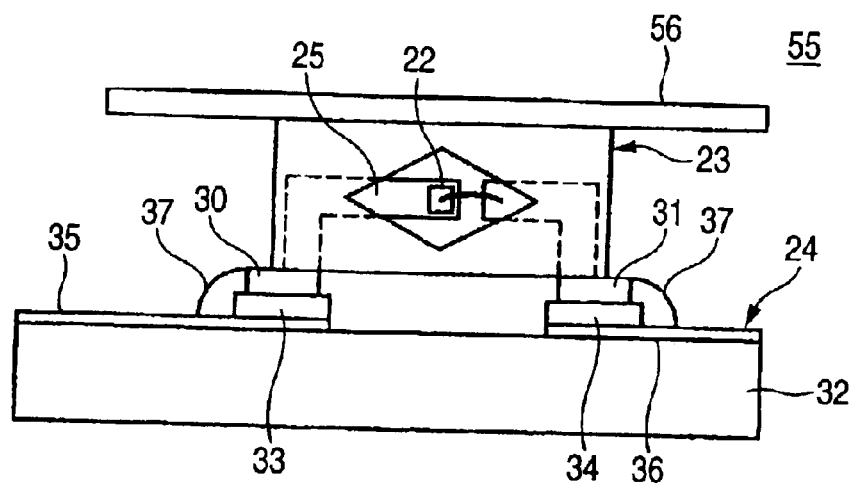
FIG. 19A is a front view showing a structure of a light emitting module of still another embodiment of the invention.
Figure 19B:
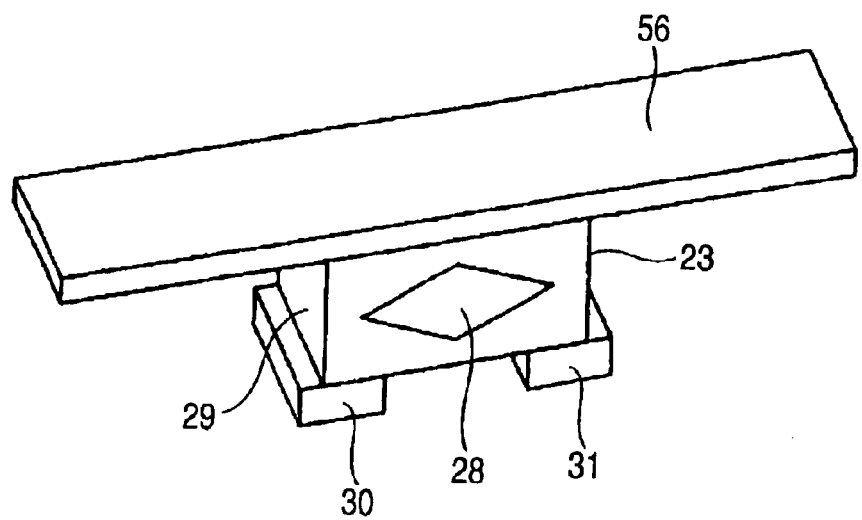
FIG. 19B is a perspective view of a light emitting component to which a heat sink is attached.

FIG. 19A is a front view showing a structure of a light emitting module 55 according to still another embodiment of the invention, and FIG. 19B is a perspective view of the light emitting component 23 to which a heat sink 56 is attached. In the light emitting module 55 according to this embodiment, the heat sink 56 is attached by adhesive etc. to the upper surface of the mold resin 29 of the light emitting component 23. The heat sink 56 is formed by a material with good heat conductivity such as a copper plate, a graphite sheet, a silicon sheet with high heat conductivity, and so on.

According to this embodiment, since the heat sink 56 is attached to the upper surface of the light emitting component 23, heat generated in the light emitting element 22 is conducted to the heat sink 56 through the mold resins 28 and 29, and dissipated from the heat sink 56 to air. Thus, it is possible to suppress decrease of luminance of the light emitting element 22 due to temperature increase and decrease of transmission factor of the mold resin 28. Also, if the heat sink 56 is disposed on the upper surface of the light emitting component 23, as in the conventional example of FIG. 4, there occurs no space between the heat sink 19 and the light emitting component so that it is possible to reduce the size of the light emitting module 55 by that. Thus, over maintaining space saving of the light emitting module 55, it is possible to effectively suppress the temperature increase of the light emitting component 23.

Figure 20:
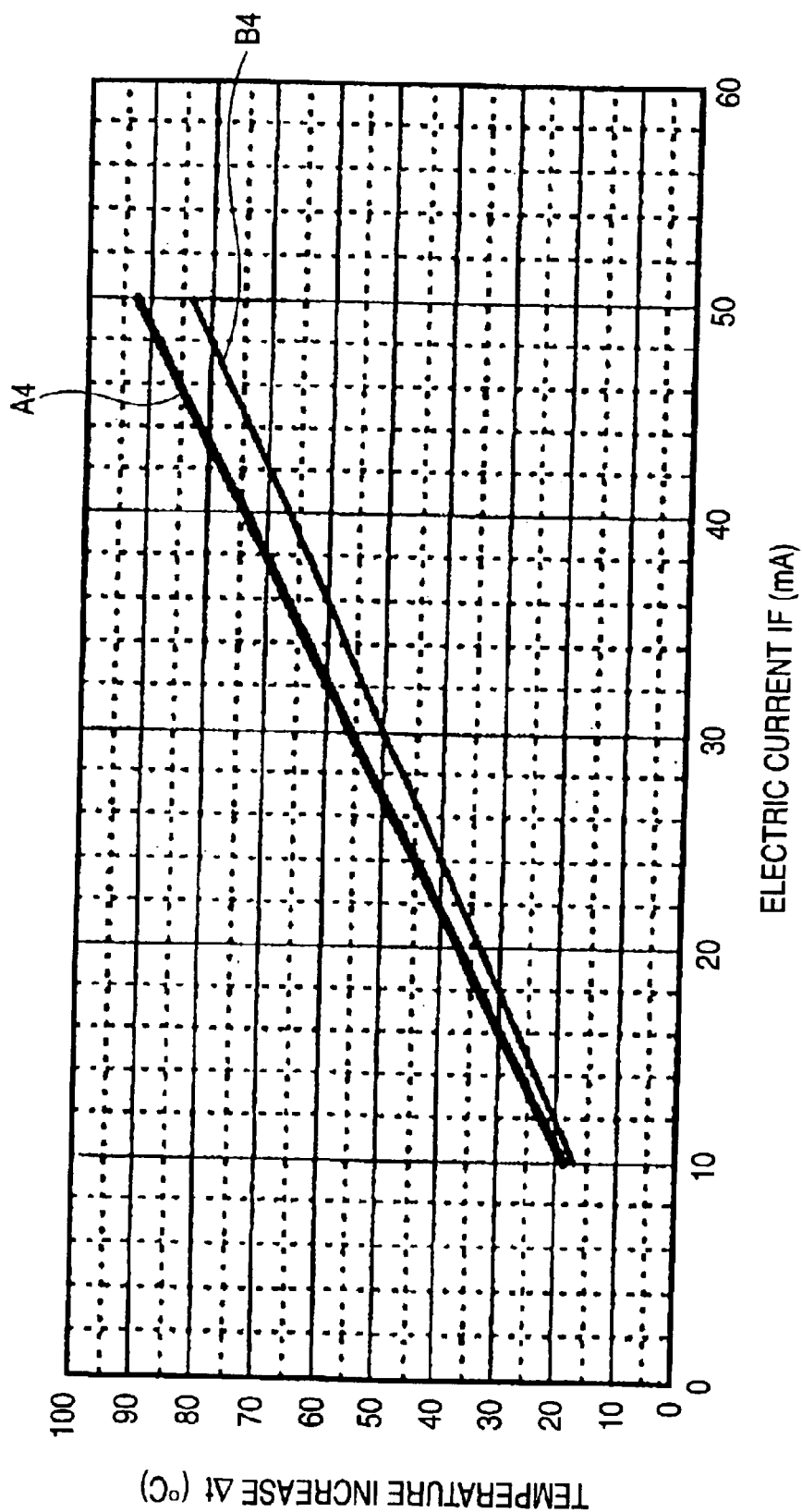
FIG. 20 is a view comparing and showing heat dissipation of the light emitting module in the conventional example and that of the light emitting module of FIG. 19.

FIG. 20 is a view comparing heat dissipation of the conventional light emitting module 1 (FIG. 1) and that of the light emitting module 55 according to this embodiment (FIG. 19). A line A4 of FIG. 20 shows temperature increase of the conventional example, and a line B4 shows temperature increase of the light emitting module 55 according to this embodiment, and a horizontal axis of FIG. 20 indicates the electric current IF which flows through the light emitting element 22, and a vertical axis indicates temperature increase (temperature difference with room temperature) Δt. As known from FIG. 20, in the light emitting module 55 of the invention, it is possible to suppress the temperature increase as compared to the light emitting module 1 of the conventional example, and a difference in the temperature increase becomes marked as the flowing electric current IF becomes larger.

(Ninth Embodiment)

Figure 21A:
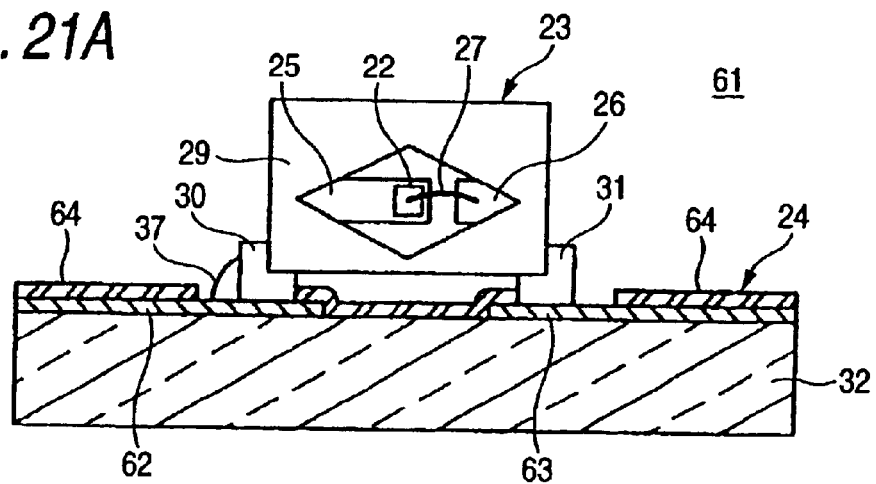
FIGS. 21A and 21B are a cross sectional view and a plan view of a light emitting module according to still another embodiment of the invention.
Figure 21B:
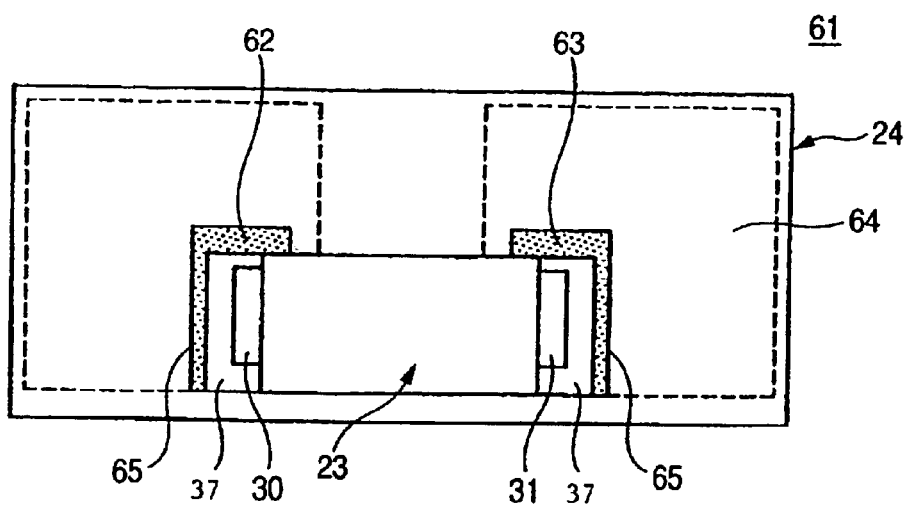
Figure 21C:
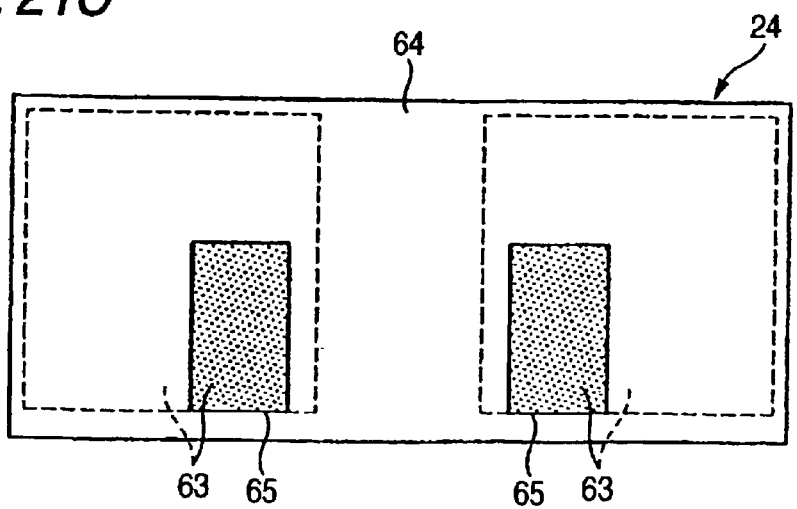
FIG. 21C is a plan view of a wiring substrate which is used in the light emitting module.

FIGS. 21A and 21B are a cross sectional view and a plan view of a light emitting module 61 according to still another embodiment of the invention. Also, FIG. 21C is a plan view of the wiring substrate 24 which is used in the light emitting module 61. In the light emitting component 23 which is used in this light emitting module 61, the mounting side outside electrode 30 which is conducted to the mounting side lead frame 25 to which the light emitting element 22 is die-bonded is disposed across from an under part of one side surface to the under surface of the mold resin 29 and, the non-mounting side outside electrode 31 conducted to the non-mounting side lead frame 26 which is connected to the light emitting element 22 through the bonding wire 27 is disposed across from an under part of the other side surface to the under surface of the mold resin 29.

Also, on the wiring substrate 24 which is used for this light emitting module 61, as shown in FIG. 21C, on almost the whole upper surface of the insulation substrate 32, at a relatively small interval, two wiring parts 62 and 63 made by Cu etc. are disposed. Furthermore, almost the entire surface of the insulation substrate 32 above the wiring parts 62 and 63 is covered by a cover lay 64 made of an insulation material for preventing solder from flowing out, and at a soldering position of the light emitting component 23, the cover lay 64 is partially opened. An opening 65 of the cover lay 64 is opened with good precision accurately, corresponding to the soldering position.

Therefore, on the occasion of automatically mounting the light emitting component 23 on the wiring substrate 24, by making exposed surfaces of the wiring parts 62 and 63 which are exposed from the opening 65 of the cover lay 64 a basis for positioning, the light emitting component 23 is mounted so that the mounting side outside electrode 30 and the non-mounting side outside electrode 31 ride on the exposed surfaces of the wiring parts 62 and 63, and the both outside electrodes 30 and 31 are soldered to the exposed surfaces of the wiring parts 62 and 63 by solder 37, respectively.

According to the suchlike light emitting module 61, since it is possible to have heat of the light emitting element 22 dissipate efficiently from the wiring parts 62 and 63 with large areas which were disposed on the wiring substrate 24, it is possible to suppress decrease of luminance of the light emitting component 23. Furthermore, according to the suchlike structure, there occurs no case that a thickness and size of the light emitting module 61 are enlarged, and it is possible to realize space saving by miniaturizing the light emitting module 61.

On the other hand, when the wiring parts 62 and 63 themselves are enlarged like this, it becomes difficult to automatically mount the light emitting component 23 with good precision on the basis of the wiring parts 62 and 63 but, in this light emitting module 61, since the cover lay 64 is accurately opened at the soldering position so that the wiring parts 62 and 63 are exposed from the opening 65, by mounting the light emitting component 23 on the basis of the position of the exposed surfaces of the opening parts 62 and 63 from the opening 65 (i.e., the opening 65 itself), it is possible to automatically mount the light emitting component 23 accurately.

Figure 23:
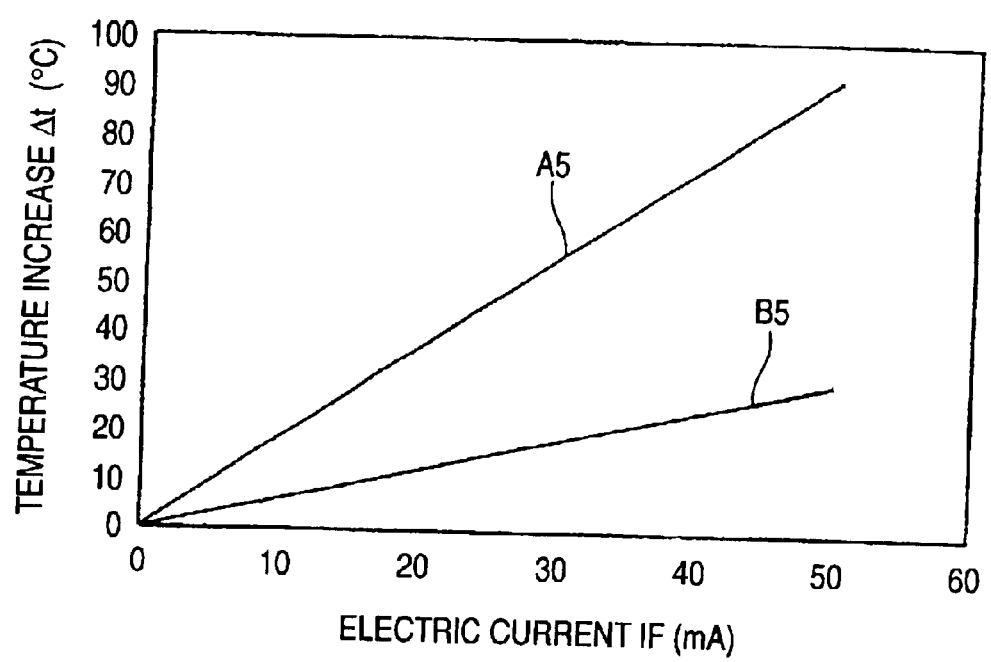
FIG. 23 is a view showing heat dissipation of the light emitting module shown in FIG. 21, relating to the invention and that of the light emitting module of the conventional example shown in FIG. 22.

FIG. 23 is a view comparing and showing heat dissipation of the light emitting module 61 shown in FIG. 21, relating to the invention and that of the light emitting module of the conventional example. A line A5 of FIG. 23 shows temperature increase of the conventional example, and a line B5 shows temperature increase of the light emitting module 61 according to this embodiment, and a horizontal axis of FIG. 23 indicates the electric current IF which flows through the light emitting element 22, and a vertical axis indicates temperature increase (temperature difference with room temperature) Δt. As known from FIG. 23, in the light emitting module 61 of the invention, it is possible to suppress the temperature increase as compared to the light emitting module of the conventional example, and a difference in the temperature increase becomes marked as the flowing electric current IF becomes larger. To be more precise, in case that the flowing electric current value is 30 mA, in the conventional example, the temperature increase Δt is 55° C. but, in the light emitting module 61 of this embodiment, with the same flowing electric current value, it is possible to reduce the temperature increase Δt to 18° C.

Figure 22A:
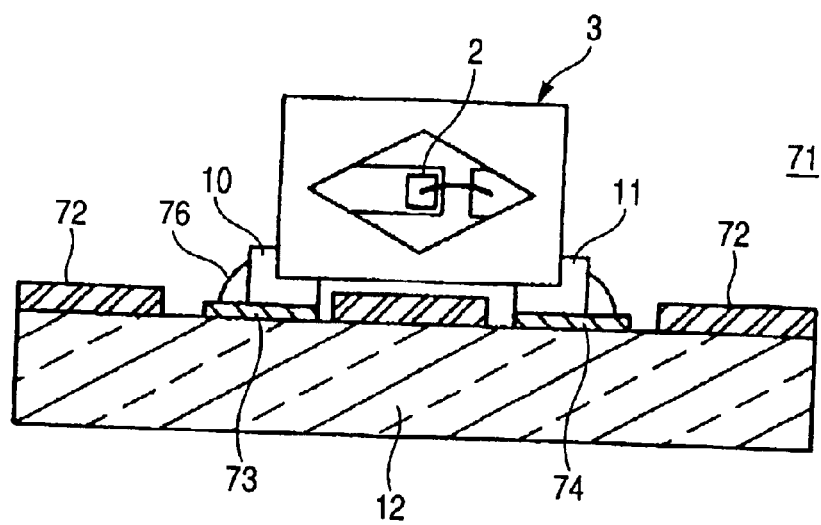
FIGS. 22A and 22B are a cross sectional view and a plan view of a light emitting module according to the conventional example for comparing with the light emitting module according to the same embodiment as above.
Figure 22B:
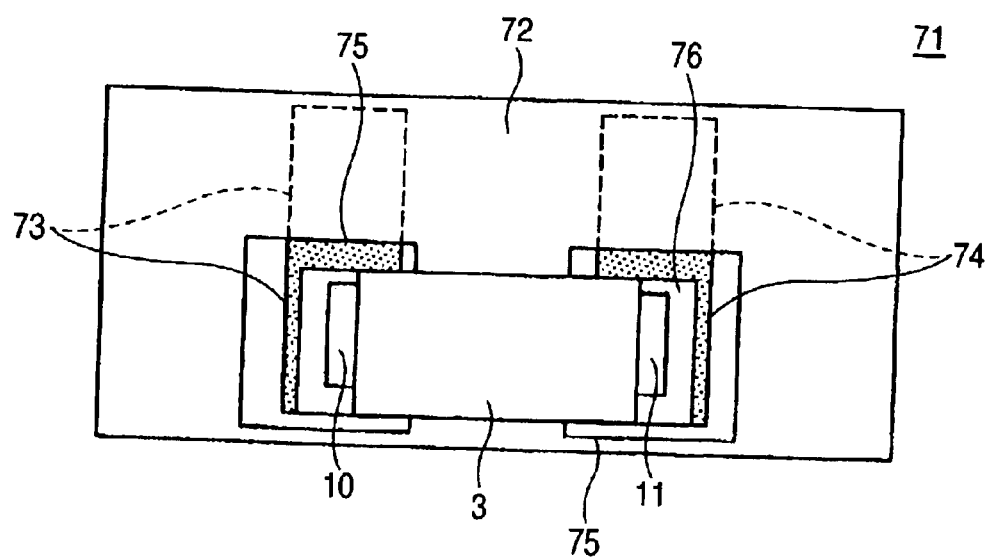

In addition, a conventional example which was used here for comparison is one which was of a structure as shown in FIG. 22. In a light emitting module 71 shown in FIGS. 22A and 22B, to the surface of the insulation substrate 12 above wiring parts 73 and 74 which are formed on the insulation substrate 12, a sheet shaped cover lay 72 in which an opening is formed is bonded, and a soldering area of the wiring parts 73 and 74 are exposed from the opening 75 of the cover lay 72. However, in the conventional light emitting module 71, since the opening 75 of the cover lay 72 is not formed with good precision, the entire soldering portion of the wiring parts 73 and 74 is made to be exposed from the opening 75 as shown in FIG. 22B, and the light emitting component 3 is mounted with the shape of the soldering portion of the wiring parts 73 and 74 which are exposed to inside of the opening 75 as a reference for positioning. As in this light emitting module 71, in case that the light emitting component 3 is mounted with the soldering portion of the wiring parts 73 and 74 as a reference for positioning, when the wiring parts 73 and 74 are enlarged too much, there occurs a case that high mounting accuracy can not be obtained on the occasion of mounting the light emitting component 3 by solder 76, and therefore, it is not possible to enlarge the wiring parts 73 and 74. Therefore, in this light emitting module 71, as shown in FIGS. 22A and 22B, the wiring parts 73 and 74 become relatively small, and because of that, it is impossible to realize high heat dissipation as in the above-described one.

In contrast to this, in the invention, since the mounting accuracy of the light emitting component 23 is heightened by heightening accuracy of the opening 65 of the cover lay 64, it is possible to enlarge the wiring parts 62 and 63, and it possible to improve the heat dissipation. Since high precision can not be obtained by the method of bonding the cover lay 72 of a resin sheet, as in the past, in the light emitting module 61 of the invention, as a cover lay material, a material of glass epoxy series is used. If the material of glass epoxy series is used, expansion and contraction due to heat and stress can be reduced, it is possible to heighten position precision of the opening 65 of the cover lay 64.

(Tenth Embodiment)

Figure 24:
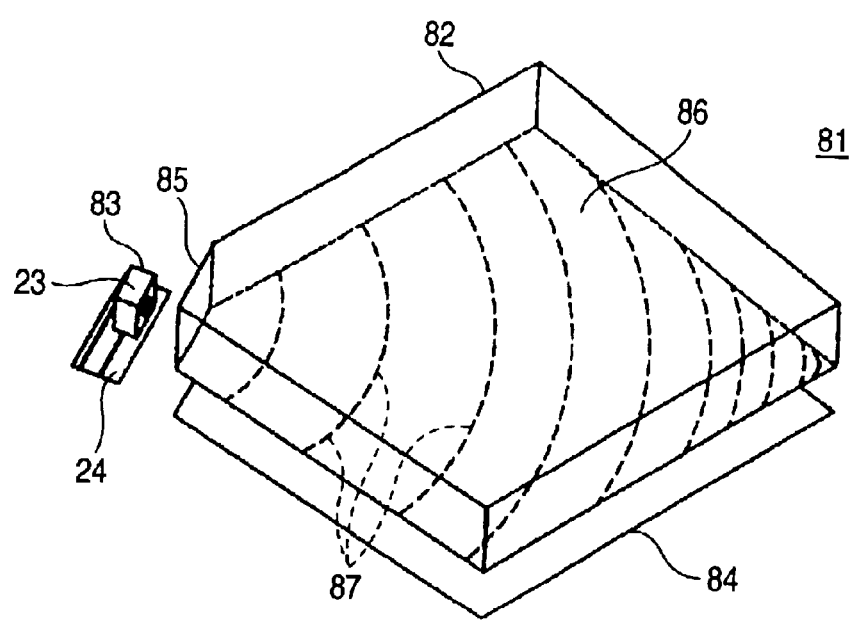
FIG. 24 is a perspective view showing a structure of a flat illuminating device according to still another embodiment of the invention.

FIG. 24 is a perspective view showing a structure of a flat illuminating device 81 according to still another embodiment of the invention. The flat illuminating device 81 comprises a light guiding plate 82, a light emitting module 83 relating to the invention, and a reflection sheet 84. The light guiding plate 82 is made by transparent resin with high refraction index such as polycarbonate resin, methacryl resin and so on, and one corner part thereof is cut sidlingly so that a light incoming surface 85 is formed, and on an opposite surface to a light outgoing surface 86 (upper surface) of the light guiding plate, a number of diffusion patterns 87 are formed. The light emitting module 83 is located so as to face the light incoming surface 85, and the diffusion patterns 87 of the light guiding plate 82 are arranged in hyperbolic shape with a central focus on the light emitting module 83, and in the vicinity of the light emitting module 83, the diffusion patterns 87 are distributed relatively coarsely, and as away from the light emitting module 83, the diffusion patterns 87 are distributed closely little by little. The reflection sheet 84 is made by a white colored resin sheet, and faces an under surface of the light guiding plate 82 on which the diffusion patterns 87 are formed.

Therefore, light exited from the light emitting module 83 enters in the light guiding plate 82 from the light incoming surface 85, and over repeating total reflection on the upper surface and the under surface of the light guiding plate 82, it is propagated in the direction of getting away from the light emitting module 83. In mid course of this, light is totally reflected by the diffusion patterns 87, and when the light reflected by the diffusion patterns 87 enters in the light outgoing surface 86 with smaller angle than a critical angle of the total reflection, it exits from the light out going surface 86 to outside. In this manner, light exits uniformly from almost the entire surface of the light out going surface 86. In addition, according to need, a prism sheet may be disposed, facing the upper surface of the light guiding plate 82.

This flat illuminating device is used for a back light etc. in a light crystal display device such as a personal computer, PDA, a portable telephone and so on.

Any light emitting module of the invention can suppress temperature increase of the light emitting module by effectively dissipating heat generated in the light emitting element, and it is possible to prevent decrease of luminance of the light emitting module. Also, in any light emitting module, it is possible to easily form heat dissipation means, and there is no necessity of a trouble some installation work, a process after installation and so on. Furthermore, in any light emitting module, it is hard for the light emitting module to become thick and large by disposing heat dissipation means, and therefore, it is possible to miniaturize the light emitting module with good heat dissipation, and it is possible to reduce a mounting space.

What is claimed is:

1. A light emitting module in which a light emitting element is mounted on a wiring substrate, wherein a heat dissipation function is given to a wiring portion which is formed on the wiring substrate and connected to the light emitting element, wherein, out of the wiring portions formed on the wiring substrate, heat dissipation of a wiring portion which is mounted on the light emitting element and is connected to the light emitting element is made to be higher than heat dissipation of a wiring portion which is not mounted on the light emitting element and is connected to the light emitting element.

* * * * *